United States Patent
Custodio et al.

(10) Patent No.: US 11,861,424 B2
(45) Date of Patent: *Jan. 2, 2024

(54) TECHNOLOGIES FOR PROVIDING EFFICIENT REPROVISIONING IN AN ACCELERATOR DEVICE

(71) Applicant: Intel Corporation, Santa Clara, CA (US)

(72) Inventors: Evan Custodio, North Attleboro, MA (US); Susanne M. Balle, Hudson, NH (US); Francesc Guim Bernat, Barcelona (ES); Slawomir Putyrski, Gdynia (PL); Joe Grecco, Saddle Brook, NJ (US); Henry Mitchel, Wayne, NJ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/471,927

(22) Filed: Sep. 10, 2021

(65) Prior Publication Data
US 2022/0138025 A1    May 5, 2022

Related U.S. Application Data

(63) Continuation of application No. 15/859,365, filed on Dec. 30, 2017, now Pat. No. 11,119,835.
(Continued)

(30) Foreign Application Priority Data

Aug. 30, 2017   (IN) .............................. 201741030632

(51) Int. Cl.
*G06F 9/54*      (2006.01)
*G02B 6/44*      (2006.01)
(Continued)

(52) U.S. Cl.
CPC ............. *G06F 9/545* (2013.01); *G02B 6/444* (2013.01); *G06F 9/541* (2013.01); *G06F 9/544* (2013.01);
(Continued)

(58) Field of Classification Search
None
See application file for complete search history.

(56) References Cited

U.S. PATENT DOCUMENTS 6,496,971 B1   12/2002   Lesea et al.
6,675,289 B1   1/2004    Eslick et al.
(Continued)

OTHER PUBLICATIONS

European First Office Action for Patent Application No. 18186430.7, dated Jun. 15, 2020, 10 pages.
(Continued)

*Primary Examiner* — Syed A Roni
(74) *Attorney, Agent, or Firm* — Compass IP Law PC

(57) ABSTRACT

Technologies for providing efficient reprovisioning in an accelerator device include an accelerator sled. The accelerator sled includes a memory and an accelerator device coupled to the memory. The accelerator device is to configure itself with a first bit stream to establish a first kernel, execute the first kernel to produce output data, write the output data to the memory, configure itself with a second bit stream to establish a second kernel, and execute the second kernel with the output data in the memory used as input data to the second kernel. Other embodiments are also described and claimed.

19 Claims, 20 Drawing Sheets

Related U.S. Application Data

(60) Provisional application No. 62/584,401, filed on Nov. 10, 2017.

(51) Int. Cl.
*G06F 15/78* (2006.01)
*H03K 19/0175* (2006.01)

(52) U.S. Cl.
CPC . *G06F 15/7871* (2013.01); *H03K 19/017581* (2013.01)

(56) References Cited

U.S. PATENT DOCUMENTS

| | | |
|---|---|---|
| 9,294,097 B1 | 3/2016 | Vassiliev |
| 9,411,613 B1 | 8/2016 | McGarry et al. |
| 10,109,030 B1 | 10/2018 | Sun et al. |
| 10,180,850 B1 | 1/2019 | Kasat et al. |
| 10,216,217 B1 | 2/2019 | Santan et al. |
| 10,275,851 B1 | 4/2019 | Zhao et al. |
| 2005/0278502 A1 | 12/2005 | Hundley |
| 2010/0095152 A1 | 4/2010 | Darrington et al. |
| 2011/0164045 A1 | 7/2011 | Costa et al. |
| 2011/0225415 A1 | 9/2011 | Yamada et al. |
| 2012/0297163 A1 | 11/2012 | Breternitz et al. |
| 2012/0330638 A1 | 12/2012 | Pell et al. |
| 2013/0191849 A1 | 7/2013 | Chapman et al. |
| 2013/0332702 A1 | 12/2013 | Boudier |
| 2014/0007128 A1 | 1/2014 | Schroth et al. |
| 2014/0035938 A1 | 2/2014 | Wang et al. |
| 2015/0281636 A1 | 10/2015 | Yu et al. |
| 2016/0173104 A1 | 6/2016 | Vassiliev |
| 2016/0301742 A1 | 10/2016 | Lowery |
| 2016/0335120 A1 | 11/2016 | Gupta et al. |
| 2016/0364271 A1 | 12/2016 | Burger et al. |
| 2016/0380865 A1 | 12/2016 | Dubal et al. |
| 2017/0163575 A1 | 6/2017 | Wang et al. |
| 2017/0256018 A1 | 9/2017 | Gandhi et al. |
| 2017/0262567 A1 | 9/2017 | Vassiliev |
| 2018/0150334 A1 | 5/2018 | Bernat et al. |
| 2018/0210732 A1 | 7/2018 | Zhu et al. |
| 2019/0042923 A1 | 2/2019 | Janedula et al. |
| 2019/0065260 A1 | 2/2019 | Balle et al. |
| 2019/0094926 A1 | 3/2019 | Subramanian et al. |
| 2019/0102224 A1 | 4/2019 | Bernat et al. |
| 2019/0155239 A1 | 5/2019 | Salhuana et al. |
| 2020/0319937 A1 | 10/2020 | Matthes |

OTHER PUBLICATIONS

European Patent Office Summons to Attend Oral Proceedings for Patent Application No. 18186430.7, Mailed Sep. 27, 2021, 12 pages.

Extended European search report for European patent application No. 18186430.7 dated Feb. 25, 2019 (13 pages).

Fahmy Suhaib A et al: Virtualized FPGA Accelerators for Efficient Cloud Technical FieldsSearched (IPC) Computing, 2015 IEEE 7th International Conference on Cloud Computing Technology and Science (CLOUDCOM), IEEE, Nov. 30, 2015 (Nov. 30, 2015), pp. 430-435.

Farrel, A, et al., "BGP Control Plane for HSH SFC", draft-mackie-bess-nsh=bsp-control-plane-01, BESS Working Group, Internet-Draft, Oct. 30, 2016, 37 pages.

Farrel, Adrian, et al., "A BGP-Based Control Plane for Service Function Chaining draft-mackie-bess-nsh-bgp-control-plane-01", Sep. 8, 2020, 9 pages.

Final Office Action for U.S. Appl. No. 15/858,316, dated Feb. 9, 2021, 19 pages.

First Office Action for U.S. Appl. No. 15/858,316, dated Oct. 21, 2020, 23 pages.

Halpern, J., et al., "Service Function Chaining (SFC) Architecture", Internet Engineering Task Force (IETF), Oct. 2015, 32 pages.

Raynovich, Scott, "What is Network Service Chaining? Definition", Topic Hub/Network Virtualization, Feb. 2016, 3 pages.

Kravatsky, Steven, "GSRD Programming FPGA—Arrow SoCKit Edition", version 2, RocketBoards.org, Jan. 30, 2014, 10 pages.

Tull, Alan, "FPGA Manager Core", 2015, downloaded from the internet Jun. 22, 2023, https://www.kernel.org/doc/Documentation/fpga/fpga-mgr.txt, 4 pages.

TECHNOLOGIES FOR PROVIDING EFFICIENT REPROVISIONING IN AN ACCELERATOR DEVICE

CROSS-REFERENCE TO RELATED APPLICATIONS

This application is a continuation of U.S. patent application Ser. No. 15/859,365, filed Dec. 30, 2017, now U.S. Pat. No. 11,119,835. U.S. patent application Ser. No. 15/859,365 claims the benefit of Indian Provisional Patent Application No. 201741030632, filed Aug. 30, 2017, and U.S. Provisional Patent Application No. 62/584,401, filed Nov. 10, 2017. The entire specifications of which are hereby incorporated herein by reference in their entirety.

BACKGROUND

In some data centers, one or more accelerator devices may be disaggregated from a compute device that performs general purpose processing (e.g., with a general purpose processor). In such systems, the compute device may request that multiple portions of a workload be accelerated to increase the overall speed at which the workload is executed. For example, an accelerator device may execute one portion, send the output resulting from the execution of that portion back to the compute device (e.g., through a network), and, afterwards, the compute device may request an accelerator device (e.g., the same accelerator device or a different accelerator device) to accelerate a subsequent portion of the workload that relies on the output of the earlier portion as input. In such systems, the compute device sends the received output data to the accelerator device that is to execute the second portion of the workload, and may receive yet another set of output data from the execution of that portion, for use by an accelerator sled for a third portion of the workload. This communication, through the network, of data produced and consumed by the accelerator device(s) in the data center may reduce the speed at which the workload could otherwise be executed.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
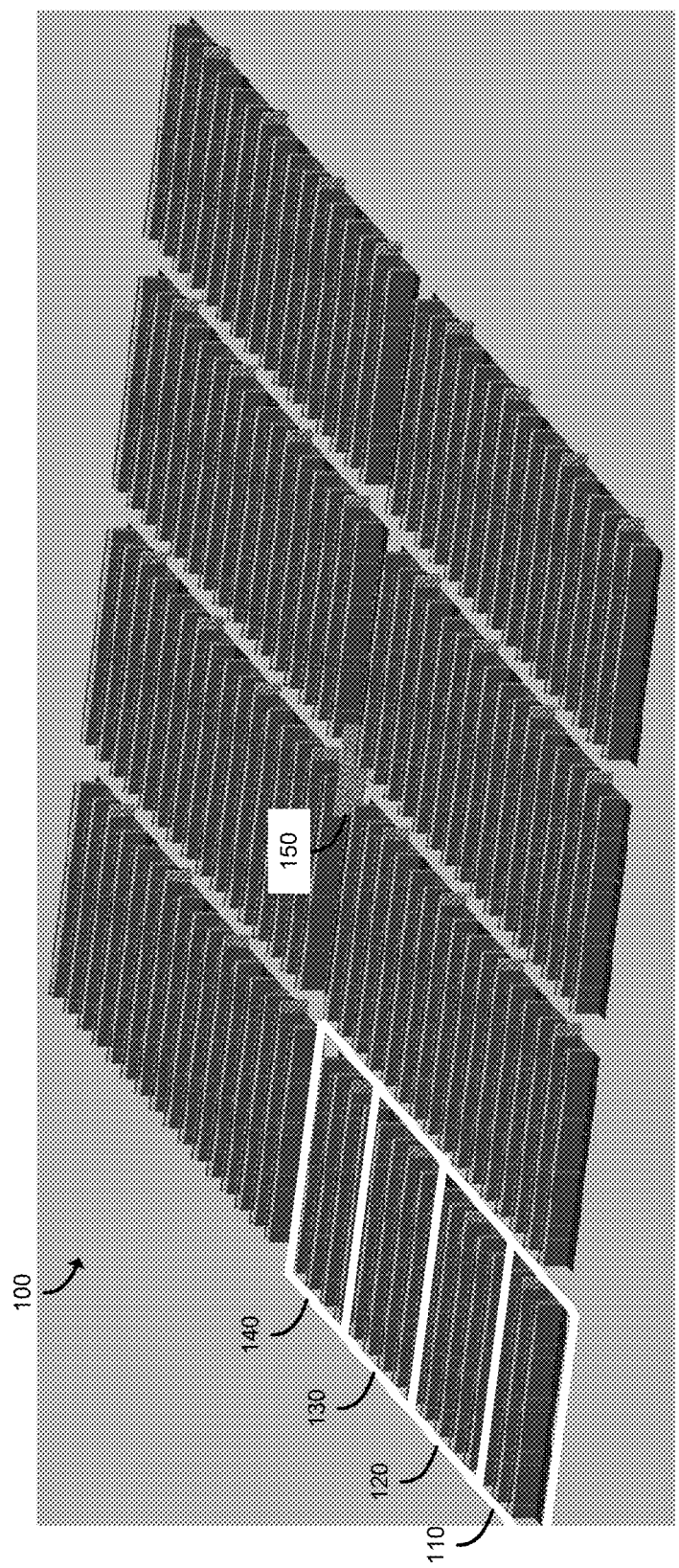
FIG. 1 is a simplified diagram of at least one embodiment of a data center for executing workloads with disaggregated resources.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a data center 100 in which disaggregated resources may cooperatively execute one or more workloads (e.g., applications on behalf of customers) includes multiple pods 110, 120, 130, 140, each of which includes one or more rows of racks. As described in more detail herein, each rack houses multiple sleds, which each may be embodied as a compute device, such as a server, that is primarily equipped with a particular type of resource (e.g., memory devices, data storage devices, accelerator devices, general purpose processors). In the illustrative embodiment, the sleds in each pod 110, 120, 130, 140 are connected to multiple pod switches (e.g., switches that route data communications to and from sleds within the pod). The pod switches, in turn, connect with spine switches 150 that switch communications among pods (e.g., the pods 110, 120, 130, 140) in the data center 100. In some embodiments, the sleds may be connected with a fabric using Intel Omni-Path technology. As described in more detail herein, resources within sleds in the data center 100 may be allocated to a group (referred to herein as a "managed node") containing resources from one or more other sleds to be collectively utilized in the execution of a workload. The workload can execute as if the resources belonging to the managed node were located on the same sled. The resources in a managed node may even belong to sleds belonging to different racks, and even to different pods 110, 120, 130, 140. Some resources of a single sled may be allocated to one managed node while other resources of the same sled are allocated to a different managed node (e.g., one processor assigned to one managed node and another processor of the same sled assigned to a different managed node). By disaggregating resources to sleds comprised predominantly of a single type of resource (e.g., compute sleds comprising primarily compute resources, memory sleds containing primarily memory resources), and selectively allocating and deallocating the disaggregated resources to form a managed node assigned to execute a workload, the data center 100 provides more efficient resource usage over typical data centers comprised of hyperconverged servers containing compute, memory, storage and perhaps additional resources). As such, the data center 100 may provide greater performance (e.g., throughput, operations per second, latency, etc.) than a typical data center that has the same number of resources.

Figure 2:
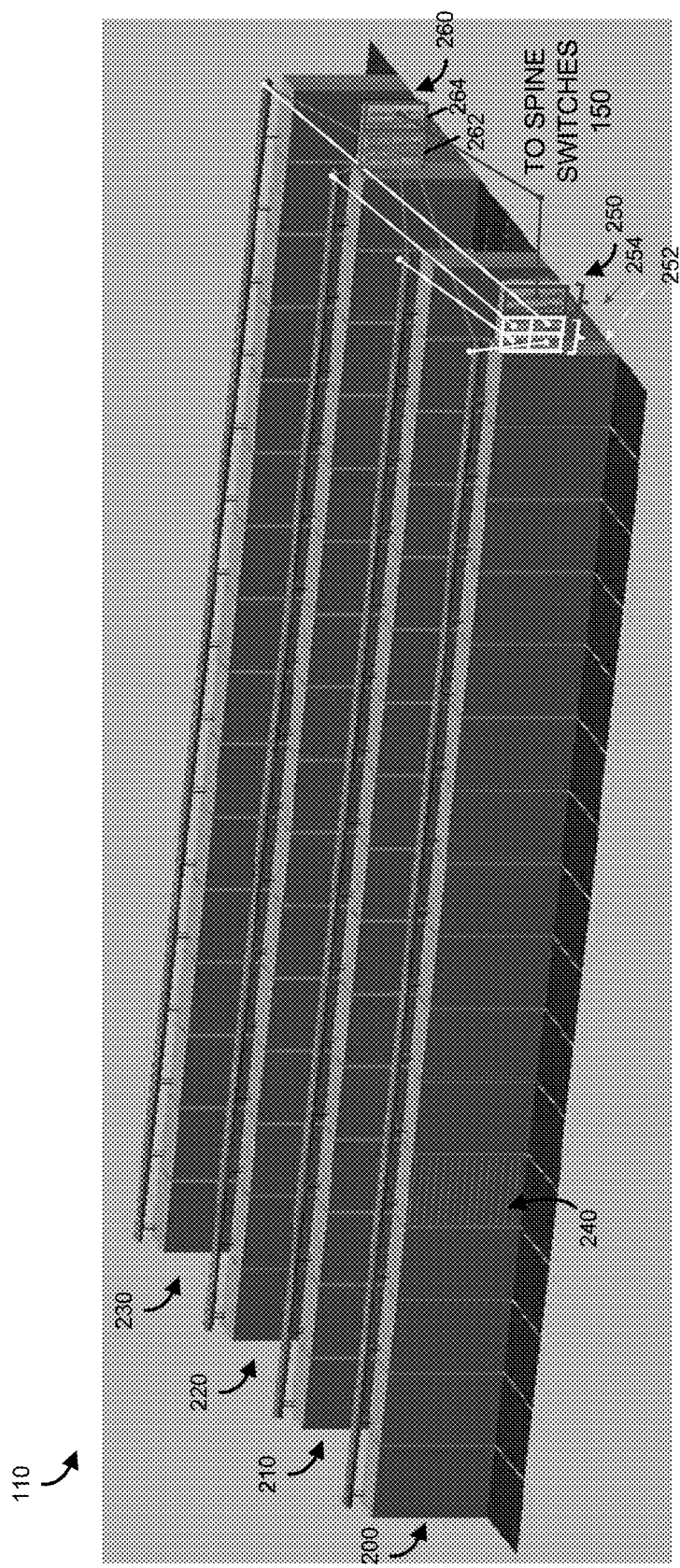
FIG. 2 is a simplified diagram of at least one embodiment of a pod of the data center of FIG. 1.

Referring now to FIG. 2, the pod 110, in the illustrative embodiment, includes a set of rows 200, 210, 220, 230 of racks 240. Each rack 240 may house multiple sleds (e.g., sixteen sleds) and provide power and data connections to the housed sleds, as described in more detail herein. In the illustrative embodiment, the racks in each row 200, 210, 220, 230 are connected to multiple pod switches 250, 260. The pod switch 250 includes a set of ports 252 to which the sleds of the racks of the pod 110 are connected and another set of ports 254 that connect the pod 110 to the spine switches 150 to provide connectivity to other pods in the data center 100. Similarly, the pod switch 260 includes a set of ports 262 to which the sleds of the racks of the pod 110 are connected and a set of ports 264 that connect the pod 110 to the spine switches 150. As such, the use of the pair of switches 250, 260 provides an amount of redundancy to the pod 110. For example, if either of the switches 250, 260 fails, the sleds in the pod 110 may still maintain data communication with the remainder of the data center 100 (e.g., sleds of other pods) through the other switch 250, 260. Furthermore, in the illustrative embodiment, the switches 150, 250, 260 may be embodied as dual-mode optical switches, capable of routing both Ethernet protocol communications carrying Internet Protocol (IP) packets and communications according to a second, high-performance link-layer protocol (e.g., Intel's Omni-Path Architecture's, Infiniband) via optical signaling media of an optical fabric.

It should be appreciated that each of the other pods 120, 130, 140 (as well as any additional pods of the data center 100) may be similarly structured as, and have components similar to, the pod 110 shown in and described in regard to FIG. 2 (e.g., each pod may have rows of racks housing multiple sleds as described above). Additionally, while two pod switches 250, 260 are shown, it should be understood that in other embodiments, each pod 110, 120, 130, 140 may be connected to different number of pod switches (e.g., providing even more failover capacity).

Figure 3:
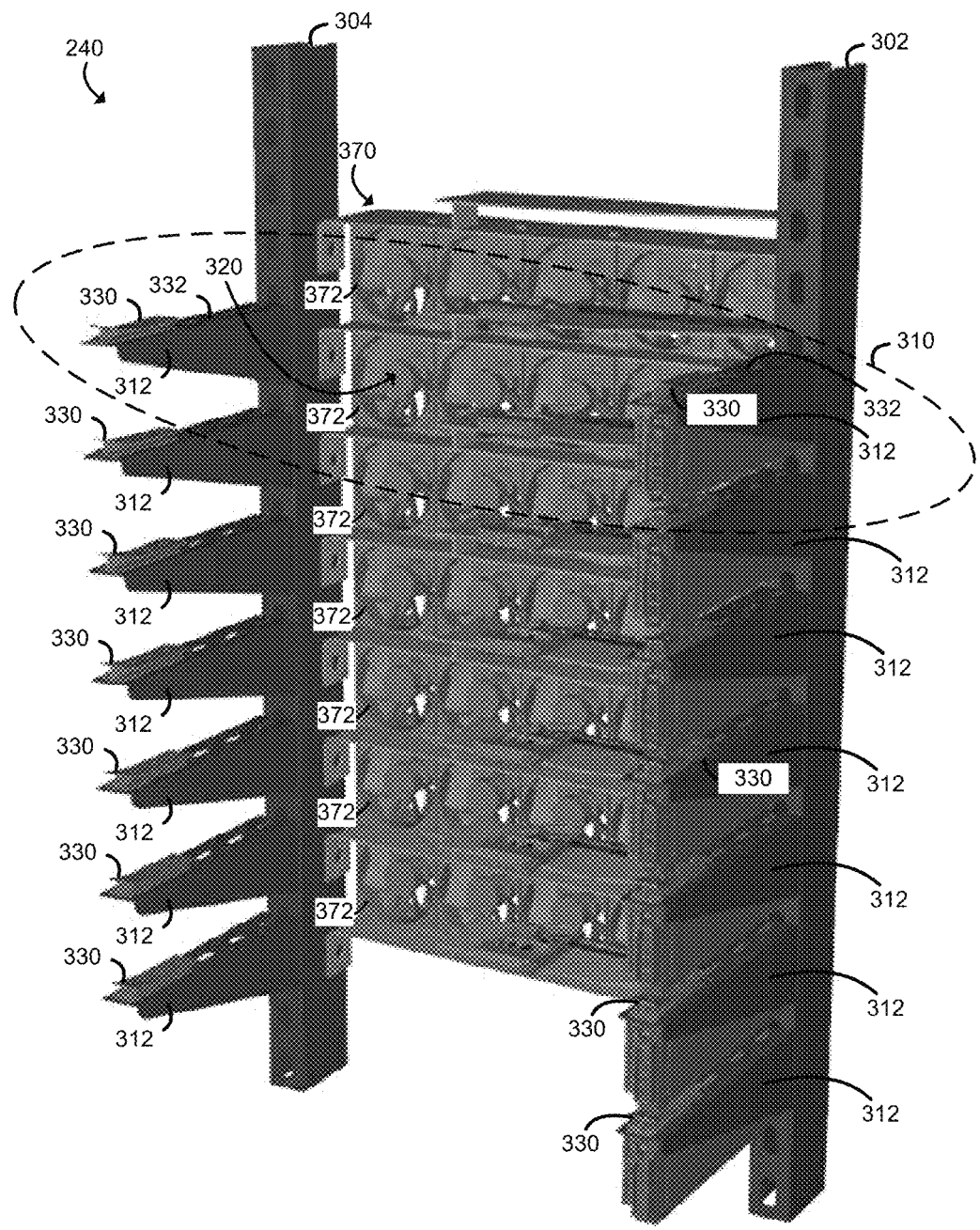
FIG. 3 is a perspective view of at least one embodiment of a rack that may be included in the pod of FIG. 2.
Figure 4:
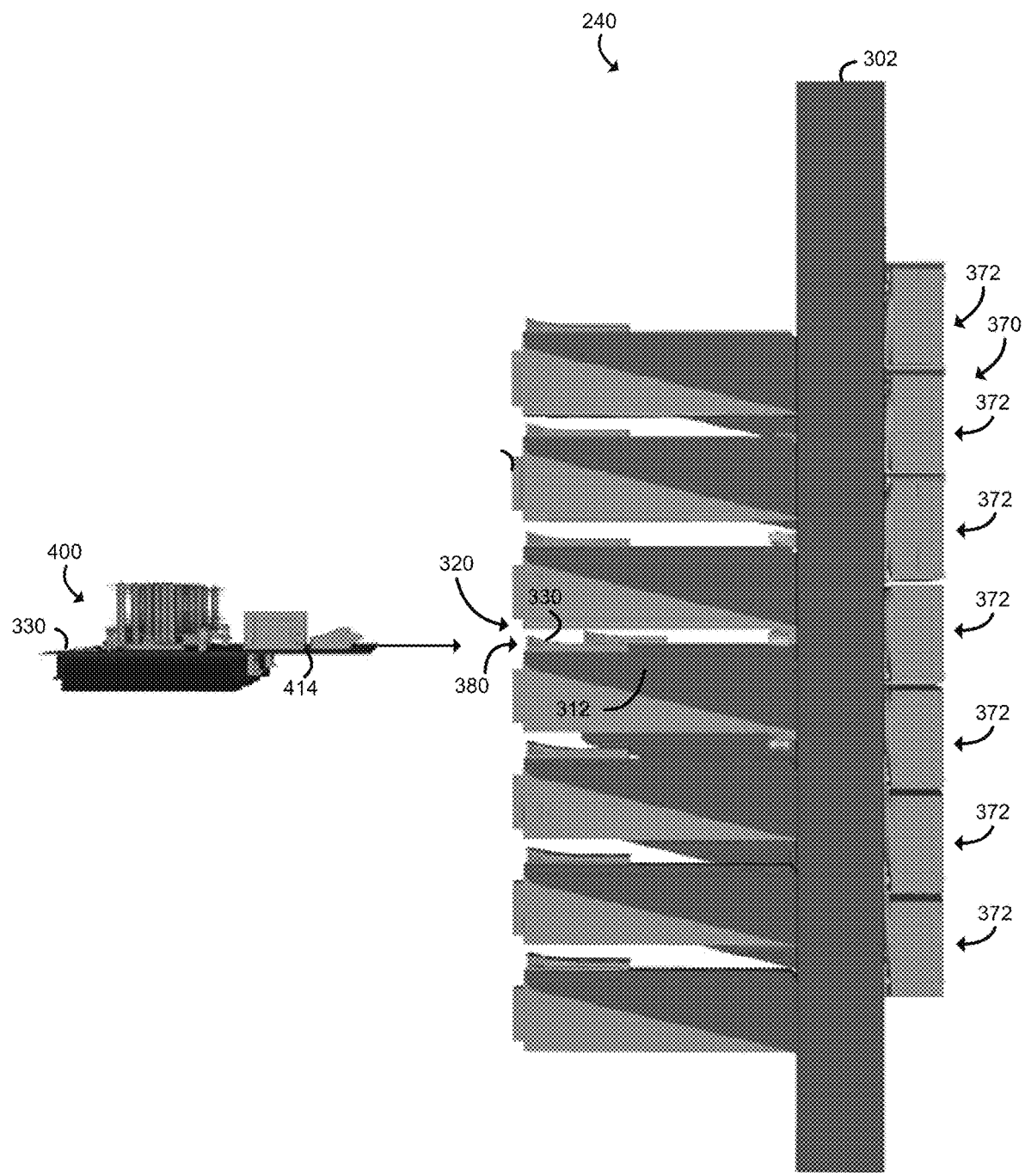
FIG. 4 is a side plan elevation view of the rack of FIG. 3.
Figure 5:
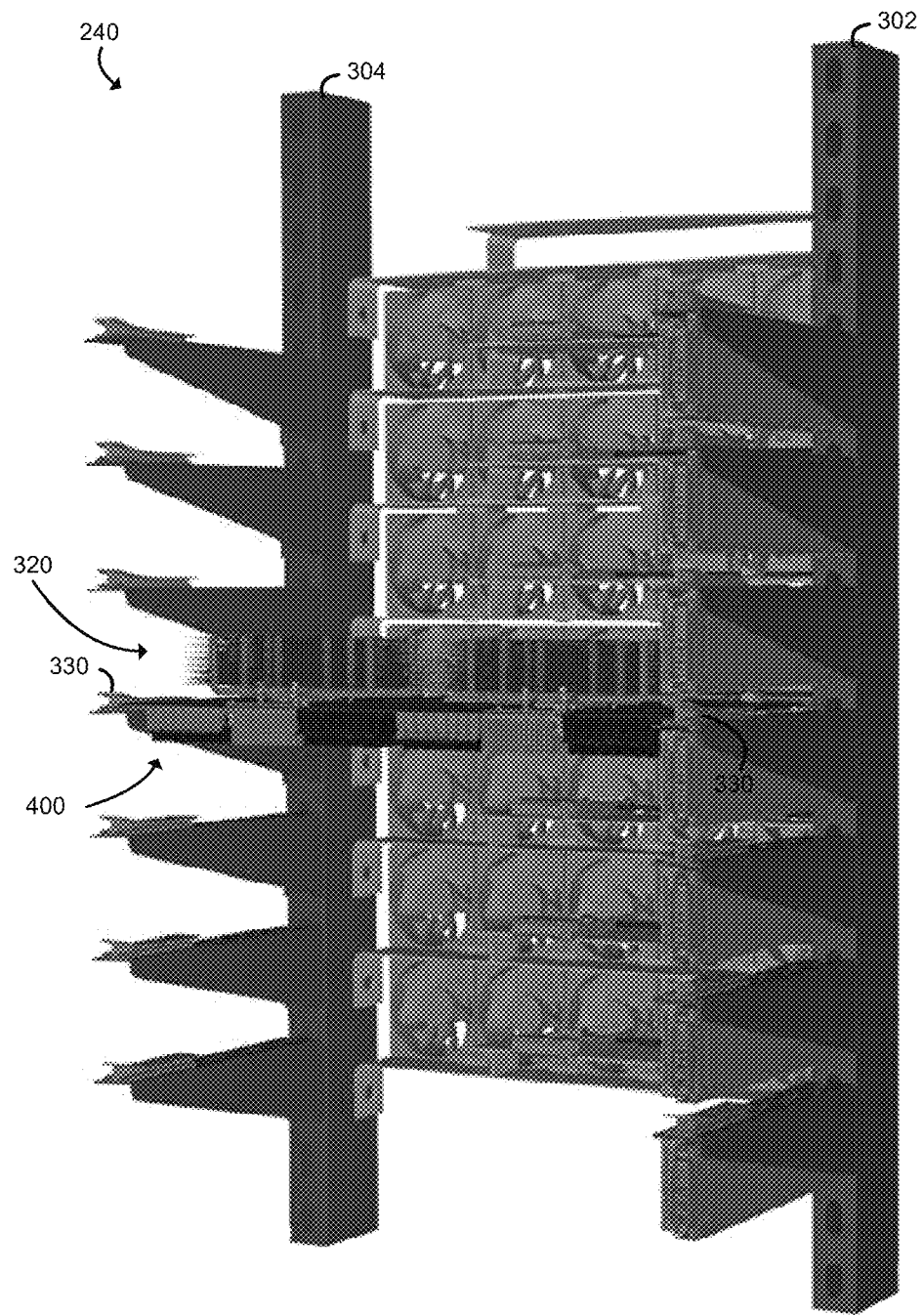
FIG. 5 is a perspective view of the rack of FIG. 3 having a sled mounted therein.

Referring now to FIGS. 3-5, each illustrative rack 240 of the data center 100 includes two elongated support posts 302, 304, which are arranged vertically. For example, the elongated support posts 302, 304 may extend upwardly from a floor of the data center 100 when deployed. The rack 240 also includes one or more horizontal pairs 310 of elongated support arms 312 (identified in FIG. 3 via a dashed ellipse) configured to support a sled of the data center 100 as discussed below. One elongated support arm 312 of the pair of elongated support arms 312 extends outwardly from the elongated support post 302 and the other elongated support arm 312 extends outwardly from the elongated support post 304.

In the illustrative embodiments, each sled of the data center 100 is embodied as a chassis-less sled. That is, each sled has a chassis-less circuit board substrate on which physical resources (e.g., processors, memory, accelerators, storage, etc.) are mounted as discussed in more detail below. As such, the rack 240 is configured to receive the chassis-less sleds. For example, each pair 310 of elongated support arms 312 defines a sled slot 320 of the rack 240, which is configured to receive a corresponding chassis-less sled. To do so, each illustrative elongated support arm 312 includes a circuit board guide 330 configured to receive the chassis-less circuit board substrate of the sled. Each circuit board guide 330 is secured to, or otherwise mounted to, a top side 332 of the corresponding elongated support arm 312. For example, in the illustrative embodiment, each circuit board guide 330 is mounted at a distal end of the corresponding elongated support arm 312 relative to the corresponding elongated support post 302, 304. For clarity of the Figures, not every circuit board guide 330 may be referenced in each Figure.

Each circuit board guide 330 includes an inner wall that defines a circuit board slot 380 configured to receive the chassis-less circuit board substrate of a sled 400 when the sled 400 is received in the corresponding sled slot 320 of the rack 240. To do so, as shown in FIG. 4, a user (or robot) aligns the chassis-less circuit board substrate of an illustrative chassis-less sled 400 to a sled slot 320. The user, or robot, may then slide the chassis-less circuit board substrate forward into the sled slot 320 such that each side edge 414 of the chassis-less circuit board substrate is received in a corresponding circuit board slot 380 of the circuit board guides 330 of the pair 310 of elongated support arms 312 that define the corresponding sled slot 320 as shown in FIG. 4. By having robotically accessible and robotically manipulable sleds comprising disaggregated resources, each type of resource can be upgraded independently of each other and at their own optimized refresh rate. Furthermore, the sleds are configured to blindly mate with power and data communication cables in each rack 240, enhancing their ability to be quickly removed, upgraded, reinstalled, and/or replaced. As such, in some embodiments, the data center 100 may operate (e.g., execute workloads, undergo maintenance and/or upgrades, etc.) without human involvement on the data center floor. In other embodiments, a human may facilitate one or more maintenance or upgrade operations in the data center 100.

It should be appreciated that each circuit board guide 330 is dual sided. That is, each circuit board guide 330 includes an inner wall that defines a circuit board slot 380 on each side of the circuit board guide 330. In this way, each circuit board guide 330 can support a chassis-less circuit board substrate on either side. As such, a single additional elongated support post may be added to the rack 240 to turn the rack 240 into a two-rack solution that can hold twice as many sled slots 320 as shown in FIG. 3. The illustrative rack 240 includes seven pairs 310 of elongated support arms 312 that define a corresponding seven sled slots 320, each configured to receive and support a corresponding sled 400 as discussed above. Of course, in other embodiments, the rack 240 may include additional or fewer pairs 310 of elongated support arms 312 (i.e., additional or fewer sled slots 320). It should be appreciated that because the sled 400 is chassis-less, the sled 400 may have an overall height that is different than typical servers. As such, in some embodiments, the height of each sled slot 320 may be shorter than the height of a typical server (e.g., shorter than a single rank unit, "1U"). That is, the vertical distance between each pair 310 of elongated support arms 312 may be less than a standard rack unit "1U." Additionally, due to the relative decrease in height of the sled slots 320, the overall height of the rack 240 in some embodiments may be shorter than the height of traditional rack enclosures. For example, in some embodiments, each of the elongated support posts 302, 304 may have a length of six feet or less. Again, in other embodiments, the rack 240 may have different dimensions. Further, it should be appreciated that the rack 240 does not include any walls, enclosures, or the like. Rather, the rack 240 is an enclosure-less rack that is opened to the local environment. Of course, in some cases, an end plate may be attached to one of the elongated support posts 302, 304 in those situations in which the rack 240 forms an end-of-row rack in the data center 100.

In some embodiments, various interconnects may be routed upwardly or downwardly through the elongated support posts 302, 304. To facilitate such routing, each elongated support post 302, 304 includes an inner wall that defines an inner chamber in which the interconnect may be located. The interconnects routed through the elongated support posts 302, 304 may be embodied as any type of interconnects including, but not limited to, data or communication interconnects to provide communication connections to each sled slot 320, power interconnects to provide power to each sled slot 320, and/or other types of interconnects.

The rack 240, in the illustrative embodiment, includes a support platform on which a corresponding optical data connector (not shown) is mounted. Each optical data connector is associated with a corresponding sled slot 320 and is configured to mate with an optical data connector of a corresponding sled 400 when the sled 400 is received in the corresponding sled slot 320. In some embodiments, optical connections between components (e.g., sleds, racks, and switches) in the data center 100 are made with a blind mate optical connection. For example, a door on each cable may prevent dust from contaminating the fiber inside the cable. In the process of connecting to a blind mate optical connector mechanism, the door is pushed open when the end of the cable enters the connector mechanism. Subsequently, the optical fiber inside the cable enters a gel within the connector mechanism and the optical fiber of one cable comes into contact with the optical fiber of another cable within the gel inside the connector mechanism.

The illustrative rack 240 also includes a fan array 370 coupled to the cross-support arms of the rack 240. The fan array 370 includes one or more rows of cooling fans 372, which are aligned in a horizontal line between the elongated support posts 302, 304. In the illustrative embodiment, the fan array 370 includes a row of cooling fans 372 for each sled slot 320 of the rack 240. As discussed above, each sled 400 does not include any on-board cooling system in the illustrative embodiment and, as such, the fan array 370 provides cooling for each sled 400 received in the rack 240. Each rack 240, in the illustrative embodiment, also includes a power supply associated with each sled slot 320. Each power supply is secured to one of the elongated support arms 312 of the pair 310 of elongated support arms 312 that define the corresponding sled slot 320. For example, the rack 240 may include a power supply coupled or secured to each elongated support arm 312 extending from the elongated support post 302. Each power supply includes a power connector configured to mate with a power connector of the sled 400 when the sled 400 is received in the corresponding sled slot 320. In the illustrative embodiment, the sled 400 does not include any on-board power supply and, as such, the power supplies provided in the rack 240 supply power to corresponding sleds 400 when mounted to the rack 240.

Figure 6:
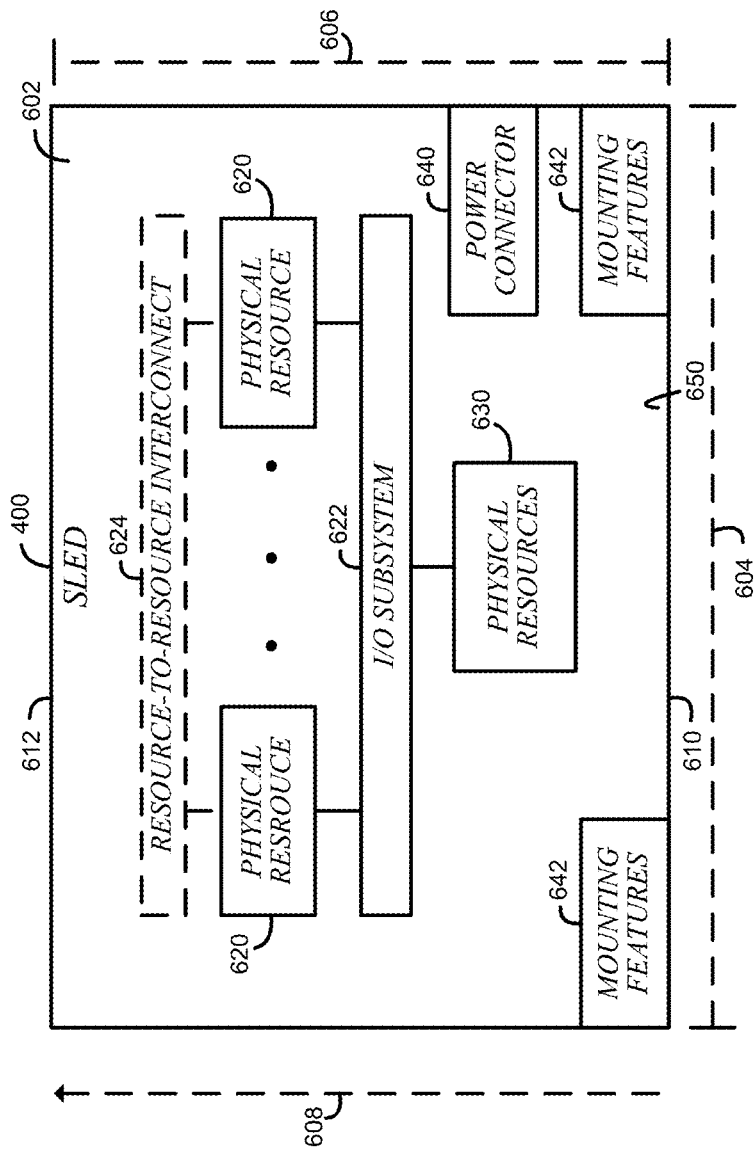
FIG. 6 is a simplified block diagram of at least one embodiment of a top side of the sled of FIG. 5.

Referring now to FIG. 6, the sled 400, in the illustrative embodiment, is configured to be mounted in a corresponding rack 240 of the data center 100 as discussed above. In some embodiments, each sled 400 may be optimized or otherwise configured for performing particular tasks, such as compute tasks, acceleration tasks, data storage tasks, etc. For example, the sled 400 may be embodied as a compute sled 800 as discussed below in regard to FIGS. 8-9, an accelerator sled 1000 as discussed below in regard to FIGS. 10-11, a storage sled 1200 as discussed below in regard to FIGS. 12-13, or as a sled optimized or otherwise configured to perform other specialized tasks, such as a memory sled 1400, discussed below in regard to FIG. 14.

As discussed above, the illustrative sled 400 includes a chassis-less circuit board substrate 602, which supports various physical resources (e.g., electrical components) mounted thereon. It should be appreciated that the circuit board substrate 602 is "chassis-less" in that the sled 400 does not include a housing or enclosure. Rather, the chassis-less circuit board substrate 602 is open to the local environment. The chassis-less circuit board substrate 602 may be formed from any material capable of supporting the various electrical components mounted thereon. For example, in an illustrative embodiment, the chassis-less circuit board substrate 602 is formed from an FR-4 glass-reinforced epoxy laminate material. Of course, other materials may be used to form the chassis-less circuit board substrate 602 in other embodiments.

As discussed in more detail below, the chassis-less circuit board substrate 602 includes multiple features that improve the thermal cooling characteristics of the various electrical components mounted on the chassis-less circuit board substrate 602. As discussed, the chassis-less circuit board substrate 602 does not include a housing or enclosure, which may improve the airflow over the electrical components of the sled 400 by reducing those structures that may inhibit air flow. For example, because the chassis-less circuit board substrate 602 is not positioned in an individual housing or enclosure, there is no backplane (e.g., a backplate of the chassis) to the chassis-less circuit board substrate 602, which could inhibit air flow across the electrical components. Additionally, the chassis-less circuit board substrate 602 has a geometric shape configured to reduce the length of the airflow path across the electrical components mounted to the chassis-less circuit board substrate 602. For example, the illustrative chassis-less circuit board substrate 602 has a width 604 that is greater than a depth 606 of the chassis-less circuit board substrate 602. In one particular embodiment, for example, the chassis-less circuit board substrate 602 has a width of about 21 inches and a depth of about 9 inches, compared to a typical server that has a width of about 17 inches and a depth of about 39 inches. As such, an airflow path 608 that extends from a front edge 610 of the chassis-less circuit board substrate 602 toward a rear edge 612 has a shorter distance relative to typical servers, which may improve the thermal cooling characteristics of the sled 400. Furthermore, although not illustrated in FIG. 6, the various physical resources mounted to the chassis-less circuit board substrate 602 are mounted in corresponding locations such that no two substantively heat-producing electrical components shadow each other as discussed in more detail below. That is, no two electrical components, which produce appreciable heat during operation (i.e., greater than a nominal heat sufficient enough to adversely impact the cooling of another electrical component), are mounted to the chassis-less circuit board substrate 602 linearly in-line with each other along the direction of the airflow path 608 (i.e., along a direction extending from the front edge 610 toward the rear edge 612 of the chassis-less circuit board substrate 602).

As discussed above, the illustrative sled 400 includes one or more physical resources 620 mounted to a top side 650 of the chassis-less circuit board substrate 602. Although two physical resources 620 are shown in FIG. 6, it should be appreciated that the sled 400 may include one, two, or more physical resources 620 in other embodiments. The physical resources 620 may be embodied as any type of processor, controller, or other compute circuit capable of performing various tasks such as compute functions and/or controlling the functions of the sled 400 depending on, for example, the type or intended functionality of the sled 400. For example, as discussed in more detail below, the physical resources 620 may be embodied as high-performance processors in embodiments in which the sled 400 is embodied as a compute sled, as accelerator co-processors or circuits in embodiments in which the sled 400 is embodied as an accelerator sled, storage controllers in embodiments in which the sled 400 is embodied as a storage sled, or a set of memory devices in embodiments in which the sled 400 is embodied as a memory sled.

The sled 400 also includes one or more additional physical resources 630 mounted to the top side 650 of the chassis-less circuit board substrate 602. In the illustrative embodiment, the additional physical resources include a network interface controller (NIC) as discussed in more detail below. Of course, depending on the type and functionality of the sled 400, the physical resources 630 may include additional or other electrical components, circuits, and/or devices in other embodiments.

The physical resources 620 are communicatively coupled to the physical resources 630 via an input/output (I/O) subsystem 622. The I/O subsystem 622 may be embodied as circuitry and/or components to facilitate input/output operations with the physical resources 620, the physical resources 630, and/or other components of the sled 400. For example, the I/O subsystem 622 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In the illustrative embodiment, the I/O subsystem 622 is embodied as, or otherwise includes, a double data rate 4 (DDR4) data bus or a DDR5 data bus.

In some embodiments, the sled 400 may also include a resource-to-resource interconnect 624. The resource-to-resource interconnect 624 may be embodied as any type of communication interconnect capable of facilitating resource-to-resource communications. In the illustrative embodiment, the resource-to-resource interconnect 624 is embodied as a high-speed point-to-point interconnect (e.g., faster than the I/O subsystem 622). For example, the resource-to-resource interconnect 624 may be embodied as a QuickPath Interconnect (QPI), an UltraPath Interconnect (UPI), or other high-speed point-to-point interconnect dedicated to resource-to-resource communications.

The sled 400 also includes a power connector 640 configured to mate with a corresponding power connector of the rack 240 when the sled 400 is mounted in the corresponding rack 240. The sled 400 receives power from a power supply of the rack 240 via the power connector 640 to supply power to the various electrical components of the sled 400. That is, the sled 400 does not include any local power supply (i.e., an on-board power supply) to provide power to the electrical components of the sled 400. The exclusion of a local or on-board power supply facilitates the reduction in the overall footprint of the chassis-less circuit board substrate 602, which may increase the thermal cooling characteristics of the various electrical components mounted on the chassis-less circuit board substrate 602 as discussed above. In some embodiments, power is provided to the processors 820 through vias directly under the processors 820 (e.g., through the bottom side 750 of the chassis-less circuit board substrate 602), providing an increased thermal budget, additional current and/or voltage, and better voltage control over typical boards.

In some embodiments, the sled 400 may also include mounting features 642 configured to mate with a mounting arm, or other structure, of a robot to facilitate the placement of the sled 600 in a rack 240 by the robot. The mounting features 642 may be embodied as any type of physical structures that allow the robot to grasp the sled 400 without damaging the chassis-less circuit board substrate 602 or the electrical components mounted thereto. For example, in some embodiments, the mounting features 642 may be embodied as non-conductive pads attached to the chassis-less circuit board substrate 602. In other embodiments, the mounting features may be embodied as brackets, braces, or other similar structures attached to the chassis-less circuit board substrate 602. The particular number, shape, size, and/or make-up of the mounting feature 642 may depend on the design of the robot configured to manage the sled 400.

Figure 7:
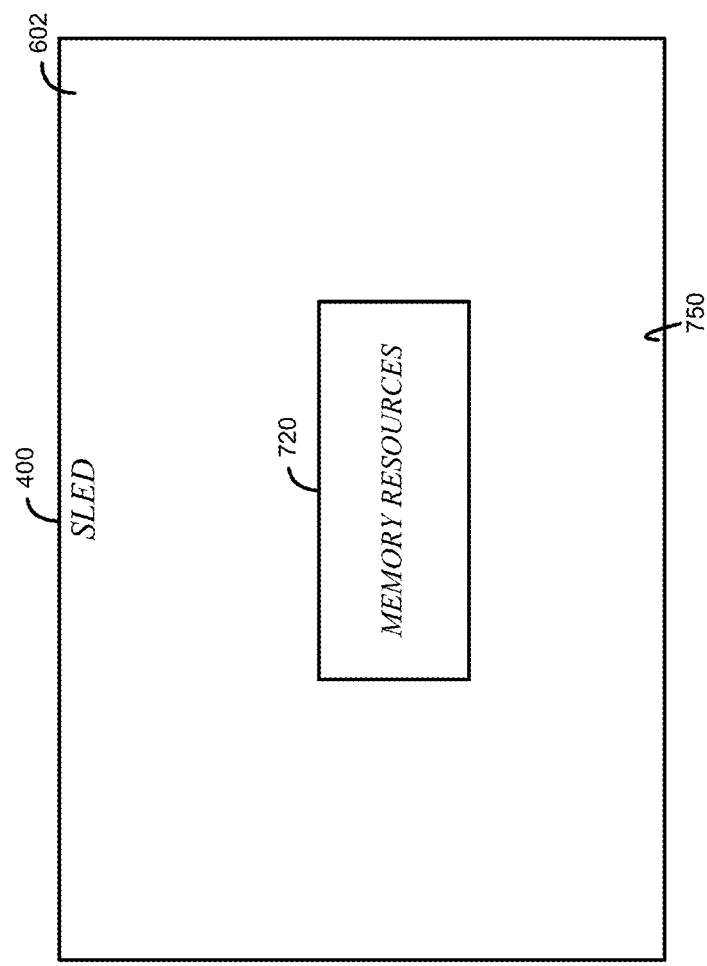
FIG. 7 is a simplified block diagram of at least one embodiment of a bottom side of the sled of FIG. 6.

Referring now to FIG. 7, in addition to the physical resources 630 mounted on the top side 650 of the chassis-less circuit board substrate 602, the sled 400 also includes one or more memory devices 720 mounted to a bottom side 750 of the chassis-less circuit board substrate 602. That is, the chassis-less circuit board substrate 602 is embodied as a double-sided circuit board. The physical resources 620 are communicatively coupled to the memory devices 720 via the I/O subsystem 622. For example, the physical resources 620 and the memory devices 720 may be communicatively coupled by one or more vias extending through the chassis-less circuit board substrate 602. Each physical resource 620 may be communicatively coupled to a different set of one or more memory devices 720 in some embodiments. Alternatively, in other embodiments, each physical resource 620 may be communicatively coupled to each memory devices 720.

The memory devices 720 may be embodied as any type of memory device capable of storing data for the physical resources 620 during operation of the sled 400, such as any type of volatile (e.g., dynamic random access memory (DRAM), etc.) or non-volatile memory. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

In one embodiment, the memory device is a block addressable memory device, such as those based on NAND or NOR technologies. A memory device may also include next-generation nonvolatile devices, such as Intel 3D XPoint™ memory or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some embodiments, the memory device may comprise a transistor-less stackable cross point architecture in which memory cells sit at the intersection of word lines and bit lines and are individually addressable and in which bit storage is based on a change in bulk resistance.

Figure 8:
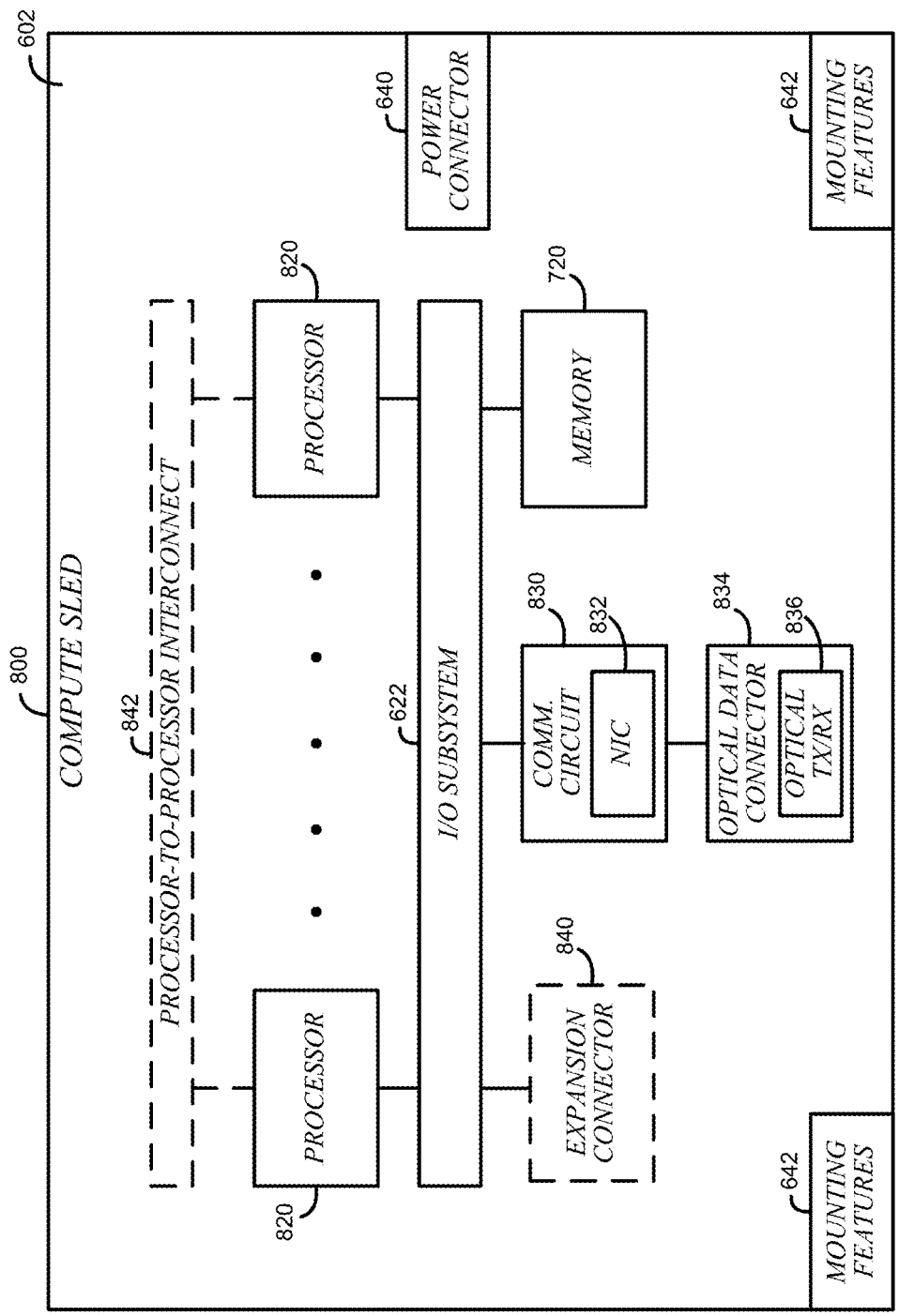
FIG. 8 is a simplified block diagram of at least one embodiment of a compute sled usable in the data center of FIG. 1.

Referring now to FIG. 8, in some embodiments, the sled 400 may be embodied as a compute sled 800. The compute sled 800 is optimized, or otherwise configured, to perform compute tasks. Of course, as discussed above, the compute sled 800 may rely on other sleds, such as acceleration sleds and/or storage sleds, to perform such compute tasks. The compute sled 800 includes various physical resources (e.g., electrical components) similar to the physical resources of the sled 400, which have been identified in FIG. 8 using the same reference numbers. The description of such components provided above in regard to FIGS. 6 and 7 applies to the corresponding components of the compute sled 800 and is not repeated herein for clarity of the description of the compute sled 800.

In the illustrative compute sled 800, the physical resources 620 are embodied as processors 820. Although only two processors 820 are shown in FIG. 8, it should be appreciated that the compute sled 800 may include additional processors 820 in other embodiments. Illustratively, the processors 820 are embodied as high-performance processors 820 and may be configured to operate at a relatively high power rating. Although the processors 820 generate additional heat operating at power ratings greater than typical processors (which operate at around 155-230 W), the enhanced thermal cooling characteristics of the chassis-less circuit board substrate 602 discussed above facilitate the higher power operation. For example, in the illustrative embodiment, the processors 820 are configured to operate at a power rating of at least 250 W. In some embodiments, the processors 820 may be configured to operate at a power rating of at least 350 W.

In some embodiments, the compute sled 800 may also include a processor-to-processor interconnect 842. Similar to the resource-to-resource interconnect 624 of the sled 400 discussed above, the processor-to-processor interconnect 842 may be embodied as any type of communication interconnect capable of facilitating processor-to-processor interconnect 842 communications. In the illustrative embodiment, the processor-to-processor interconnect 842 is embodied as a high-speed point-to-point interconnect (e.g., faster than the I/O subsystem 622). For example, the processor-to-processor interconnect 842 may be embodied as a QuickPath Interconnect (QPI), an UltraPath Interconnect (UPI), or other high-speed point-to-point interconnect dedicated to processor-to-processor communications.

The compute sled 800 also includes a communication circuit 830. The illustrative communication circuit 830 includes a network interface controller (NIC) 832, which may also be referred to as a host fabric interface (HFI). The NIC 832 may be embodied as, or otherwise include, any type of integrated circuit, discrete circuits, controller chips, chipsets, add-in-boards, daughtercards, network interface cards, other devices that may be used by the compute sled 800 to connect with another compute device (e.g., with other sleds 400). In some embodiments, the NIC 832 may be embodied as part of a system-on-a-chip (SoC) that includes one or more processors, or included on a multichip package that also contains one or more processors. In some embodiments, the NIC 832 may include a local processor (not shown) and/or a local memory (not shown) that are both local to the NIC 832. In such embodiments, the local processor of the NIC 832 may be capable of performing one or more of the functions of the processors 820. Additionally or alternatively, in such embodiments, the local memory of the NIC 832 may be integrated into one or more components of the compute sled at the board level, socket level, chip level, and/or other levels.

The communication circuit 830 is communicatively coupled to an optical data connector 834. The optical data connector 834 is configured to mate with a corresponding optical data connector of the rack 240 when the compute sled 800 is mounted in the rack 240. Illustratively, the optical data connector 834 includes a plurality of optical fibers which lead from a mating surface of the optical data connector 834 to an optical transceiver 836. The optical transceiver 836 is configured to convert incoming optical signals from the rack-side optical data connector to electrical signals and to convert electrical signals to outgoing optical signals to the rack-side optical data connector. Although shown as forming part of the optical data connector 834 in the illustrative embodiment, the optical transceiver 836 may form a portion of the communication circuit 830 in other embodiments.

In some embodiments, the compute sled 800 may also include an expansion connector 840. In such embodiments, the expansion connector 840 is configured to mate with a corresponding connector of an expansion chassis-less circuit board substrate to provide additional physical resources to the compute sled 800. The additional physical resources may be used, for example, by the processors 820 during operation of the compute sled 800. The expansion chassis-less circuit board substrate may be substantially similar to the chassis-less circuit board substrate 602 discussed above and may include various electrical components mounted thereto. The particular electrical components mounted to the expansion chassis-less circuit board substrate may depend on the intended functionality of the expansion chassis-less circuit board substrate. For example, the expansion chassis-less circuit board substrate may provide additional compute resources, memory resources, and/or storage resources. As such, the additional physical resources of the expansion chassis-less circuit board substrate may include, but is not limited to, processors, memory devices, storage devices, and/or accelerator circuits including, for example, field programmable gate arrays (FPGA), application-specific integrated circuits (ASICs), security co-processors, graphics processing units (GPUs), machine learning circuits, or other specialized processors, controllers, devices, and/or circuits.

Figure 9:
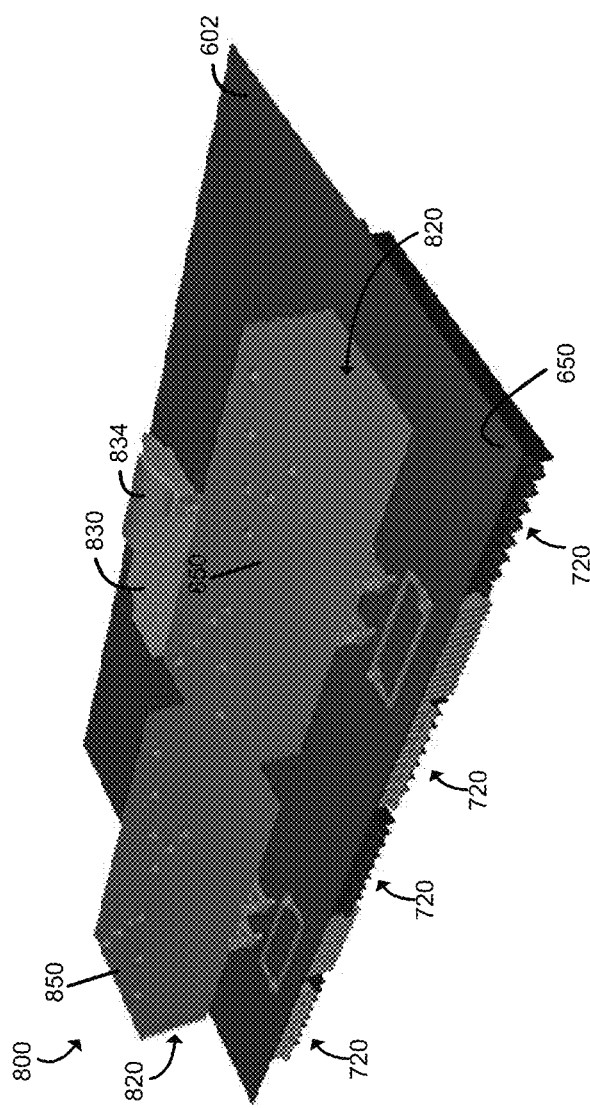
FIG. 9 is a top perspective view of at least one embodiment of the compute sled of FIG. 8.

Referring now to FIG. 9, an illustrative embodiment of the compute sled 800 is shown. As shown, the processors 820, communication circuit 830, and optical data connector 834 are mounted to the top side 650 of the chassis-less circuit board substrate 602. Any suitable attachment or mounting technology may be used to mount the physical resources of the compute sled 800 to the chassis-less circuit board substrate 602. For example, the various physical resources may be mounted in corresponding sockets (e.g., a processor socket), holders, or brackets. In some cases, some of the electrical components may be directly mounted to the chassis-less circuit board substrate 602 via soldering or similar techniques.

As discussed above, the individual processors 820 and communication circuit 830 are mounted to the top side 650 of the chassis-less circuit board substrate 602 such that no two heat-producing, electrical components shadow each other. In the illustrative embodiment, the processors 820 and communication circuit 830 are mounted in corresponding locations on the top side 650 of the chassis-less circuit board substrate 602 such that no two of those physical resources are linearly in-line with others along the direction of the airflow path 608. It should be appreciated that, although the optical data connector 834 is in-line with the communication circuit 830, the optical data connector 834 produces no or nominal heat during operation.

The memory devices 720 of the compute sled 800 are mounted to the bottom side 750 of the of the chassis-less circuit board substrate 602 as discussed above in regard to the sled 400. Although mounted to the bottom side 750, the memory devices 720 are communicatively coupled to the processors 820 located on the top side 650 via the I/O subsystem 622. Because the chassis-less circuit board substrate 602 is embodied as a double-sided circuit board, the memory devices 720 and the processors 820 may be communicatively coupled by one or more vias, connectors, or other mechanisms extending through the chassis-less circuit board substrate 602. Of course, each processor 820 may be communicatively coupled to a different set of one or more memory devices 720 in some embodiments. Alternatively, in other embodiments, each processor 820 may be communicatively coupled to each memory device 720. In some embodiments, the memory devices 720 may be mounted to one or more memory mezzanines on the bottom side of the chassis-less circuit board substrate 602 and may interconnect with a corresponding processor 820 through a ball-grid array.

Each of the processors 820 includes a heatsink 850 secured thereto. Due to the mounting of the memory devices 720 to the bottom side 750 of the chassis-less circuit board substrate 602 (as well as the vertical spacing of the sleds 400 in the corresponding rack 240), the top side 650 of the chassis-less circuit board substrate 602 includes additional "free" area or space that facilitates the use of heatsinks 850 having a larger size relative to traditional heatsinks used in typical servers. Additionally, due to the improved thermal cooling characteristics of the chassis-less circuit board substrate 602, none of the processor heatsinks 850 include cooling fans attached thereto. That is, each of the heatsinks 850 is embodied as a fan-less heatsinks.

Figure 10:
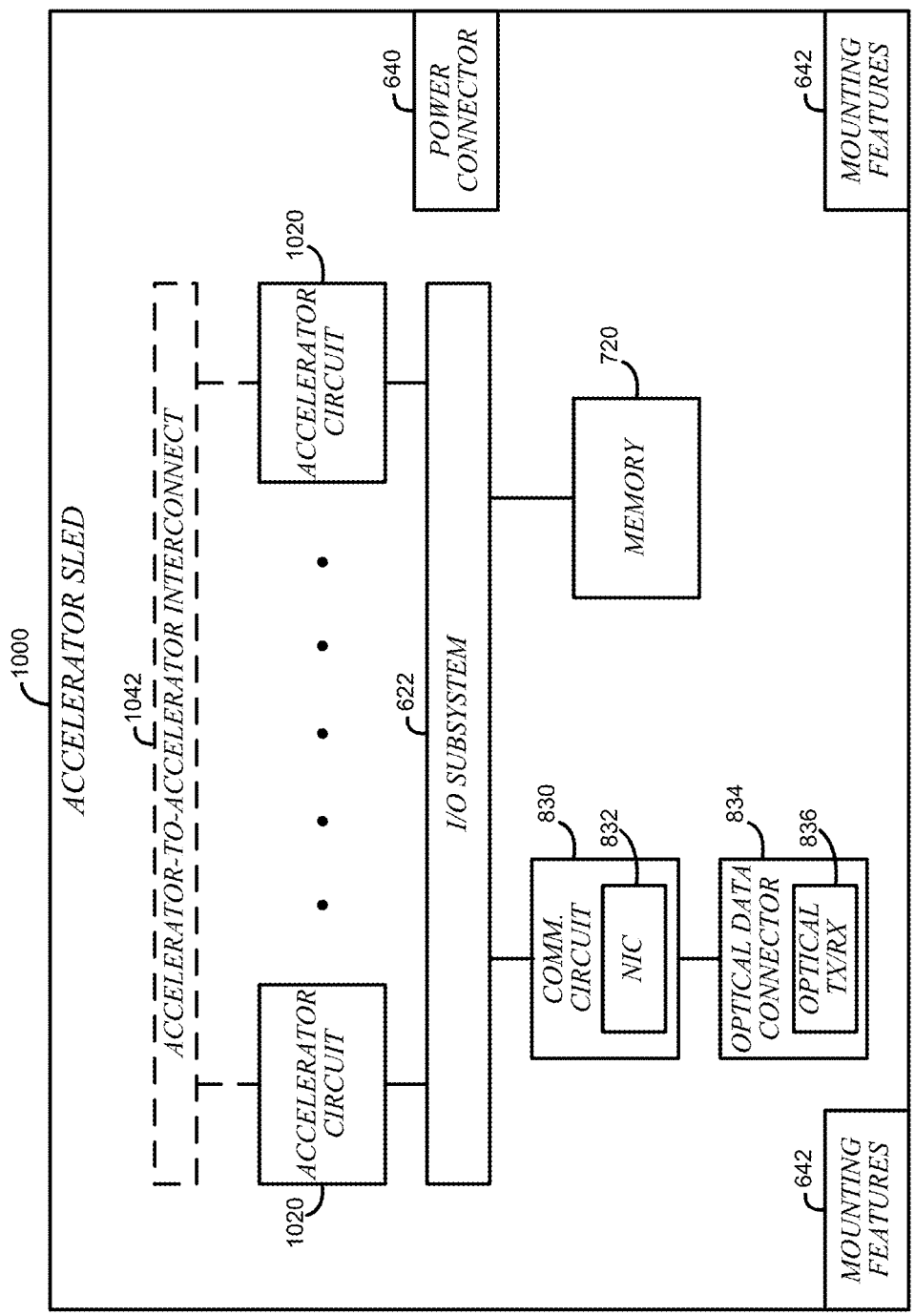
FIG. 10 is a simplified block diagram of at least one embodiment of an accelerator sled usable in the data center of FIG. 1.

Referring now to FIG. 10, in some embodiments, the sled 400 may be embodied as an accelerator sled 1000. The accelerator sled 1000 is optimized, or otherwise configured, to perform specialized compute tasks, such as machine learning, encryption, hashing, or other computational-intensive task. In some embodiments, for example, a compute sled 800 may offload tasks to the accelerator sled 1000 during operation. The accelerator sled 1000 includes various components similar to components of the sled 400 and/or compute sled 800, which have been identified in FIG. 10 using the same reference numbers. The description of such components provided above in regard to FIGS. 6, 7, and 8 apply to the corresponding components of the accelerator sled 1000 and is not repeated herein for clarity of the description of the accelerator sled 1000.

Figure 11:
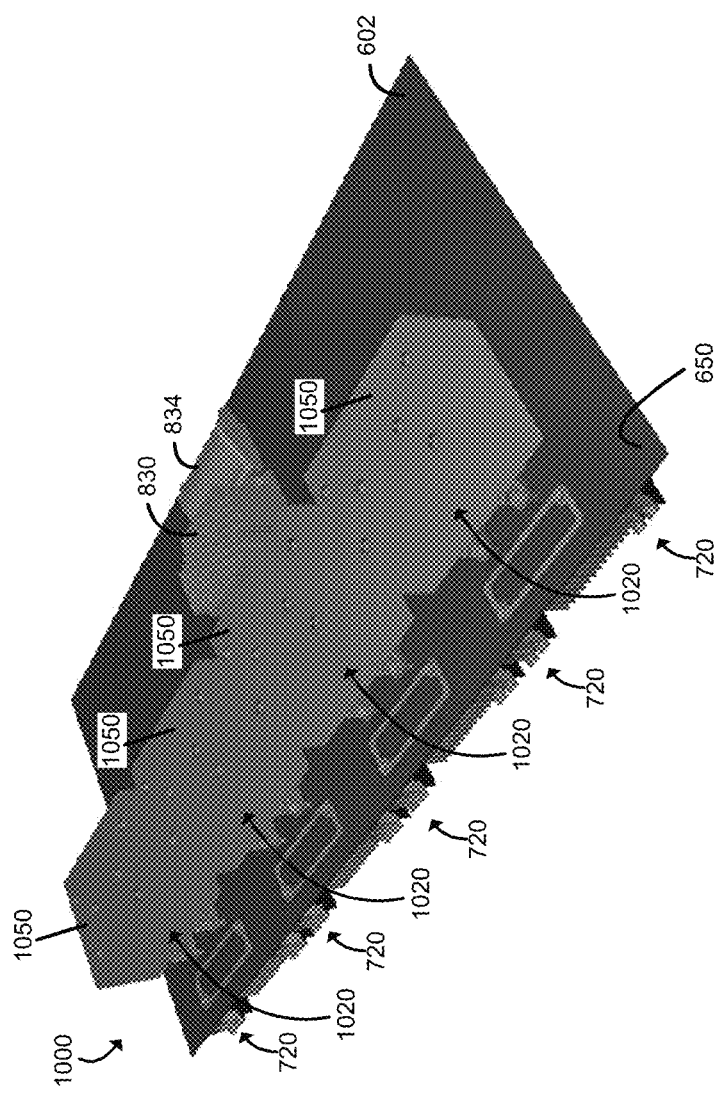
FIG. 11 is a top perspective view of at least one embodiment of the accelerator sled of FIG. 10.

In the illustrative accelerator sled 1000, the physical resources 620 are embodied as accelerator circuits 1020. Although only two accelerator circuits 1020 are shown in FIG. 10, it should be appreciated that the accelerator sled 1000 may include additional accelerator circuits 1020 in other embodiments. For example, as shown in FIG. 11, the accelerator sled 1000 may include four accelerator circuits 1020 in some embodiments. The accelerator circuits 1020 may be embodied as any type of processor, co-processor, compute circuit, or other device capable of performing compute or processing operations. For example, the accelerator circuits 1020 may be embodied as, for example, field programmable gate arrays (FPGA), application-specific integrated circuits (ASICs), security co-processors, graphics processing units (GPUs), machine learning circuits, or other specialized processors, controllers, devices, and/or circuits.

In some embodiments, the accelerator sled 1000 may also include an accelerator-to-accelerator interconnect 1042. Similar to the resource-to-resource interconnect 624 of the sled 600 discussed above, the accelerator-to-accelerator interconnect 1042 may be embodied as any type of communication interconnect capable of facilitating accelerator-to-accelerator communications. In the illustrative embodiment, the accelerator-to-accelerator interconnect 1042 is embodied as a high-speed point-to-point interconnect (e.g., faster than the I/O subsystem 622). For example, the accelerator-to-accelerator interconnect 1042 may be embodied as a QuickPath Interconnect (QPI), an UltraPath Interconnect (UPI), or other high-speed point-to-point interconnect dedicated to processor-to-processor communications. In some embodiments, the accelerator circuits 1020 may be daisy-chained with a primary accelerator circuit 1020 connected to the NIC 832 and memory 720 through the I/O subsystem 622 and a secondary accelerator circuit 1020 connected to the NIC 832 and memory 720 through a primary accelerator circuit 1020.

Referring now to FIG. 11, an illustrative embodiment of the accelerator sled 1000 is shown. As discussed above, the accelerator circuits 1020, communication circuit 830, and optical data connector 834 are mounted to the top side 650 of the chassis-less circuit board substrate 602. Again, the individual accelerator circuits 1020 and communication circuit 830 are mounted to the top side 650 of the chassis-less circuit board substrate 602 such that no two heat-producing, electrical components shadow each other as discussed above. The memory devices 720 of the accelerator sled 1000 are mounted to the bottom side 750 of the of the chassis-less circuit board substrate 602 as discussed above in regard to the sled 600. Although mounted to the bottom side 750, the memory devices 720 are communicatively coupled to the accelerator circuits 1020 located on the top side 650 via the I/O subsystem 622 (e.g., through vias). Further, each of the accelerator circuits 1020 may include a heatsink 1070 that is larger than a traditional heatsink used in a server. As discussed above with reference to the heatsinks 870, the heatsinks 1070 may be larger than tradition heatsinks because of the "free" area provided by the memory devices 750 being located on the bottom side 750 of the chassis-less circuit board substrate 602 rather than on the top side 650.

Figure 12:
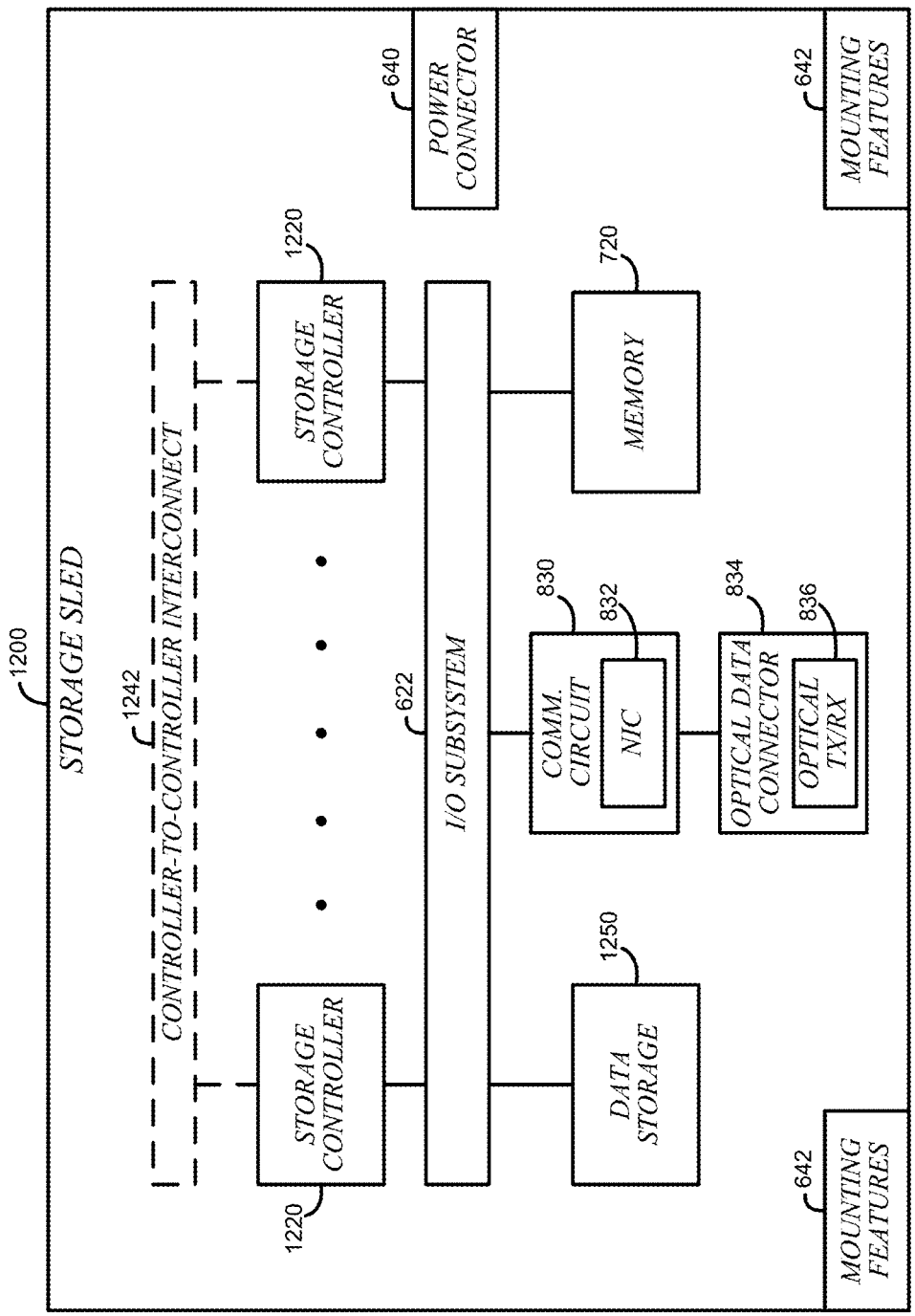
FIG. 12 is a simplified block diagram of at least one embodiment of a storage sled usable in the data center of FIG. 1.

Referring now to FIG. 12, in some embodiments, the sled 400 may be embodied as a storage sled 1200. The storage sled 1200 is optimized, or otherwise configured, to store data in a data storage 1250 local to the storage sled 1200. For example, during operation, a compute sled 800 or an accelerator sled 1000 may store and retrieve data from the data storage 1250 of the storage sled 1200. The storage sled 1200 includes various components similar to components of the sled 400 and/or the compute sled 800, which have been identified in FIG. 12 using the same reference numbers. The description of such components provided above in regard to FIGS. 6, 7, and 8 apply to the corresponding components of the storage sled 1200 and is not repeated herein for clarity of the description of the storage sled 1200.

In the illustrative storage sled 1200, the physical resources 620 are embodied as storage controllers 1220.

Although only two storage controllers 1220 are shown in FIG. 12, it should be appreciated that the storage sled 1200 may include additional storage controllers 1220 in other embodiments. The storage controllers 1220 may be embodied as any type of processor, controller, or control circuit capable of controlling the storage and retrieval of data into the data storage 1250 based on requests received via the communication circuit 830. In the illustrative embodiment, the storage controllers 1220 are embodied as relatively low-power processors or controllers. For example, in some embodiments, the storage controllers 1220 may be configured to operate at a power rating of about 75 watts.

In some embodiments, the storage sled 1200 may also include a controller-to-controller interconnect 1242. Similar to the resource-to-resource interconnect 624 of the sled 400 discussed above, the controller-to-controller interconnect 1242 may be embodied as any type of communication interconnect capable of facilitating controller-to-controller communications. In the illustrative embodiment, the controller-to-controller interconnect 1242 is embodied as a high-speed point-to-point interconnect (e.g., faster than the I/O subsystem 622). For example, the controller-to-controller interconnect 1242 may be embodied as a QuickPath Interconnect (QPI), an UltraPath Interconnect (UPI), or other high-speed point-to-point interconnect dedicated to processor-to-processor communications.

Figure 13:
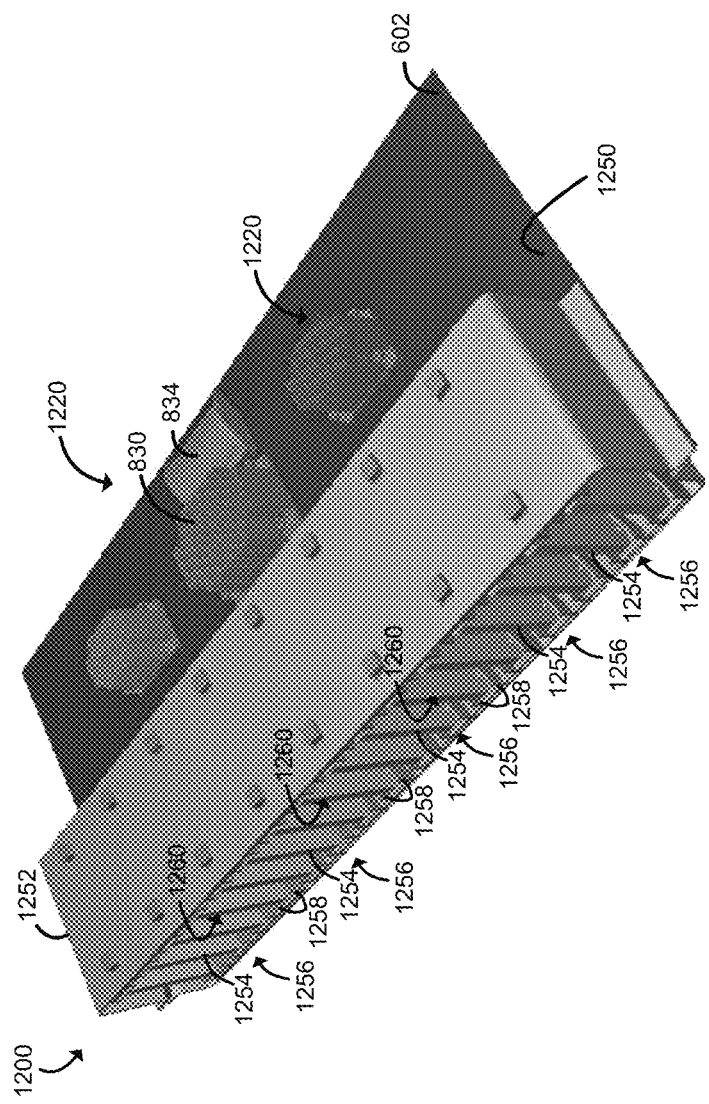
FIG. 13 is a top perspective view of at least one embodiment of the storage sled of FIG. 12.

Referring now to FIG. 13, an illustrative embodiment of the storage sled 1200 is shown. In the illustrative embodiment, the data storage 1250 is embodied as, or otherwise includes, a storage cage 1252 configured to house one or more solid state drives (SSDs) 1254. To do so, the storage cage 1252 includes a number of mounting slots 1256, each of which is configured to receive a corresponding solid state drive 1254. Each of the mounting slots 1256 includes a number of drive guides 1258 that cooperate to define an access opening 1260 of the corresponding mounting slot 1256. The storage cage 1252 is secured to the chassis-less circuit board substrate 602 such that the access openings face away from (i.e., toward the front of) the chassis-less circuit board substrate 602. As such, solid state drives 1254 are accessible while the storage sled 1200 is mounted in a corresponding rack 204. For example, a solid state drive 1254 may be swapped out of a rack 240 (e.g., via a robot) while the storage sled 1200 remains mounted in the corresponding rack 240.

The storage cage 1252 illustratively includes sixteen mounting slots 1256 and is capable of mounting and storing sixteen solid state drives 1254. Of course, the storage cage 1252 may be configured to store additional or fewer solid state drives 1254 in other embodiments. Additionally, in the illustrative embodiment, the solid state drivers are mounted vertically in the storage cage 1252, but may be mounted in the storage cage 1252 in a different orientation in other embodiments. Each solid state drive 1254 may be embodied as any type of data storage device capable of storing long term data. To do so, the solid state drives 1254 may include volatile and non-volatile memory devices discussed above.

As shown in FIG. 13, the storage controllers 1220, the communication circuit 830, and the optical data connector 834 are illustratively mounted to the top side 650 of the chassis-less circuit board substrate 602. Again, as discussed above, any suitable attachment or mounting technology may be used to mount the electrical components of the storage sled 1200 to the chassis-less circuit board substrate 602 including, for example, sockets (e.g., a processor socket), holders, brackets, soldered connections, and/or other mounting or securing techniques.

As discussed above, the individual storage controllers 1220 and the communication circuit 830 are mounted to the top side 650 of the chassis-less circuit board substrate 602 such that no two heat-producing, electrical components shadow each other. For example, the storage controllers 1220 and the communication circuit 830 are mounted in corresponding locations on the top side 650 of the chassis-less circuit board substrate 602 such that no two of those electrical components are linearly in-line with other along the direction of the airflow path 608.

The memory devices 720 of the storage sled 1200 are mounted to the bottom side 750 of the of the chassis-less circuit board substrate 602 as discussed above in regard to the sled 400. Although mounted to the bottom side 750, the memory devices 720 are communicatively coupled to the storage controllers 1220 located on the top side 650 via the I/O subsystem 622. Again, because the chassis-less circuit board substrate 602 is embodied as a double-sided circuit board, the memory devices 720 and the storage controllers 1220 may be communicatively coupled by one or more vias, connectors, or other mechanisms extending through the chassis-less circuit board substrate 602. Each of the storage controllers 1220 includes a heatsink 1270 secured thereto. As discussed above, due to the improved thermal cooling characteristics of the chassis-less circuit board substrate 602 of the storage sled 1200, none of the heatsinks 1270 include cooling fans attached thereto. That is, each of the heatsinks 1270 is embodied as a fan-less heatsink.

Figure 14:
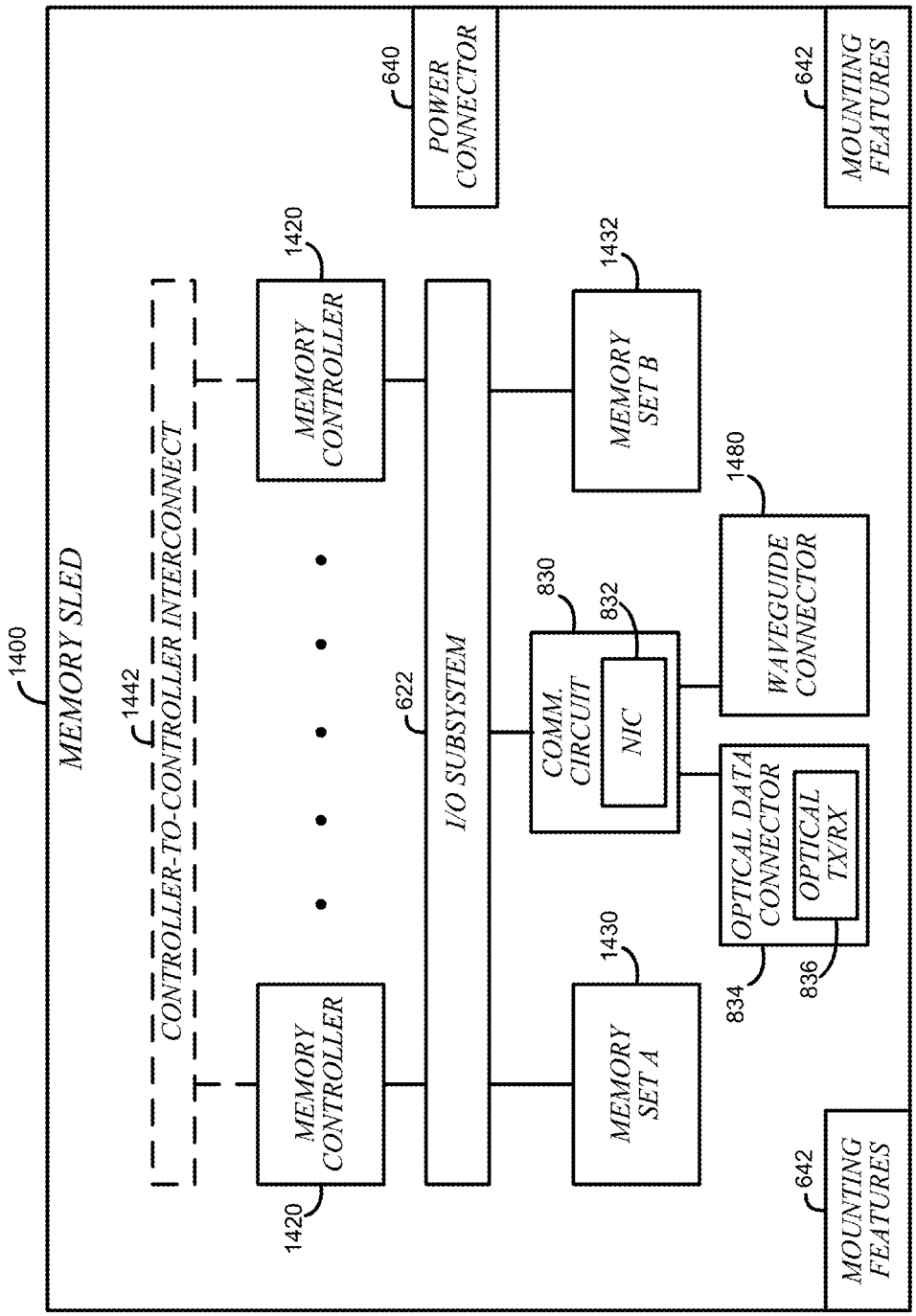
FIG. 14 is a simplified block diagram of at least one embodiment of a memory sled usable in the data center of FIG. 1.

Referring now to FIG. 14, in some embodiments, the sled 400 may be embodied as a memory sled 1400. The storage sled 1400 is optimized, or otherwise configured, to provide other sleds 400 (e.g., compute sleds 800, accelerator sleds 1000, etc.) with access to a pool of memory (e.g., in two or more sets 1430, 1432 of memory devices 720) local to the memory sled 1200. For example, during operation, a compute sled 800 or an accelerator sled 1000 may remotely write to and/or read from one or more of the memory sets 1430, 1432 of the memory sled 1200 using a logical address space that maps to physical addresses in the memory sets 1430, 1432. The memory sled 1400 includes various components similar to components of the sled 400 and/or the compute sled 800, which have been identified in FIG. 14 using the same reference numbers. The description of such components provided above in regard to FIGS. 6, 7, and 8 apply to the corresponding components of the memory sled 1400 and is not repeated herein for clarity of the description of the memory sled 1400.

In the illustrative memory sled 1400, the physical resources 620 are embodied as memory controllers 1420. Although only two memory controllers 1420 are shown in FIG. 14, it should be appreciated that the memory sled 1400 may include additional memory controllers 1420 in other embodiments. The memory controllers 1420 may be embodied as any type of processor, controller, or control circuit capable of controlling the writing and reading of data into the memory sets 1430, 1432 based on requests received via the communication circuit 830. In the illustrative embodiment, each storage controller 1220 is connected to a corresponding memory set 1430, 1432 to write to and read from memory devices 720 within the corresponding memory set 1430, 1432 and enforce any permissions (e.g., read, write, etc.) associated with sled 400 that has sent a request to the memory sled 1400 to perform a memory access operation (e.g., read or write).

In some embodiments, the memory sled 1400 may also include a controller-to-controller interconnect 1442. Similar to the resource-to-resource interconnect 624 of the sled 400 discussed above, the controller-to-controller interconnect 1442 may be embodied as any type of communication interconnect capable of facilitating controller-to-controller communications. In the illustrative embodiment, the controller-to-controller interconnect 1442 is embodied as a high-speed point-to-point interconnect (e.g., faster than the I/O subsystem 622). For example, the controller-to-controller interconnect 1442 may be embodied as a QuickPath Interconnect (QPI), an UltraPath Interconnect (UPI), or other high-speed point-to-point interconnect dedicated to processor-to-processor communications. As such, in some embodiments, a memory controller 1420 may access, through the controller-to-controller interconnect 1442, memory that is within the memory set 1432 associated with another memory controller 1420. In some embodiments, a scalable memory controller is made of multiple smaller memory controllers, referred to herein as "chiplets", on a memory sled (e.g., the memory sled 1400). The chiplets may be interconnected (e.g., using EMIB (Embedded Multi-Die Interconnect Bridge)). The combined chiplet memory controller may scale up to a relatively large number of memory controllers and I/O ports, (e.g., up to 16 memory channels). In some embodiments, the memory controllers 1420 may implement a memory interleave (e.g., one memory address is mapped to the memory set 1430, the next memory address is mapped to the memory set 1432, and the third address is mapped to the memory set 1430, etc.). The interleaving may be managed within the memory controllers 1420, or from CPU sockets (e.g., of the compute sled 800) across network links to the memory sets 1430, 1432, and may improve the latency associated with performing memory access operations as compared to accessing contiguous memory addresses from the same memory device.

Further, in some embodiments, the memory sled 1400 may be connected to one or more other sleds 400 (e.g., in the same rack 240 or an adjacent rack 240) through a waveguide, using the waveguide connector 1480. In the illustrative embodiment, the waveguides are 64 millimeter waveguides that provide 16 Rx (i.e., receive) lanes and 16 Rt (i.e., transmit) lanes. Each lane, in the illustrative embodiment, is either 16 Ghz or 32 Ghz. In other embodiments, the frequencies may be different. Using a waveguide may provide high throughput access to the memory pool (e.g., the memory sets 1430, 1432) to another sled (e.g., a sled 400 in the same rack 240 or an adjacent rack 240 as the memory sled 1400) without adding to the load on the optical data connector 834.

Figure 15:
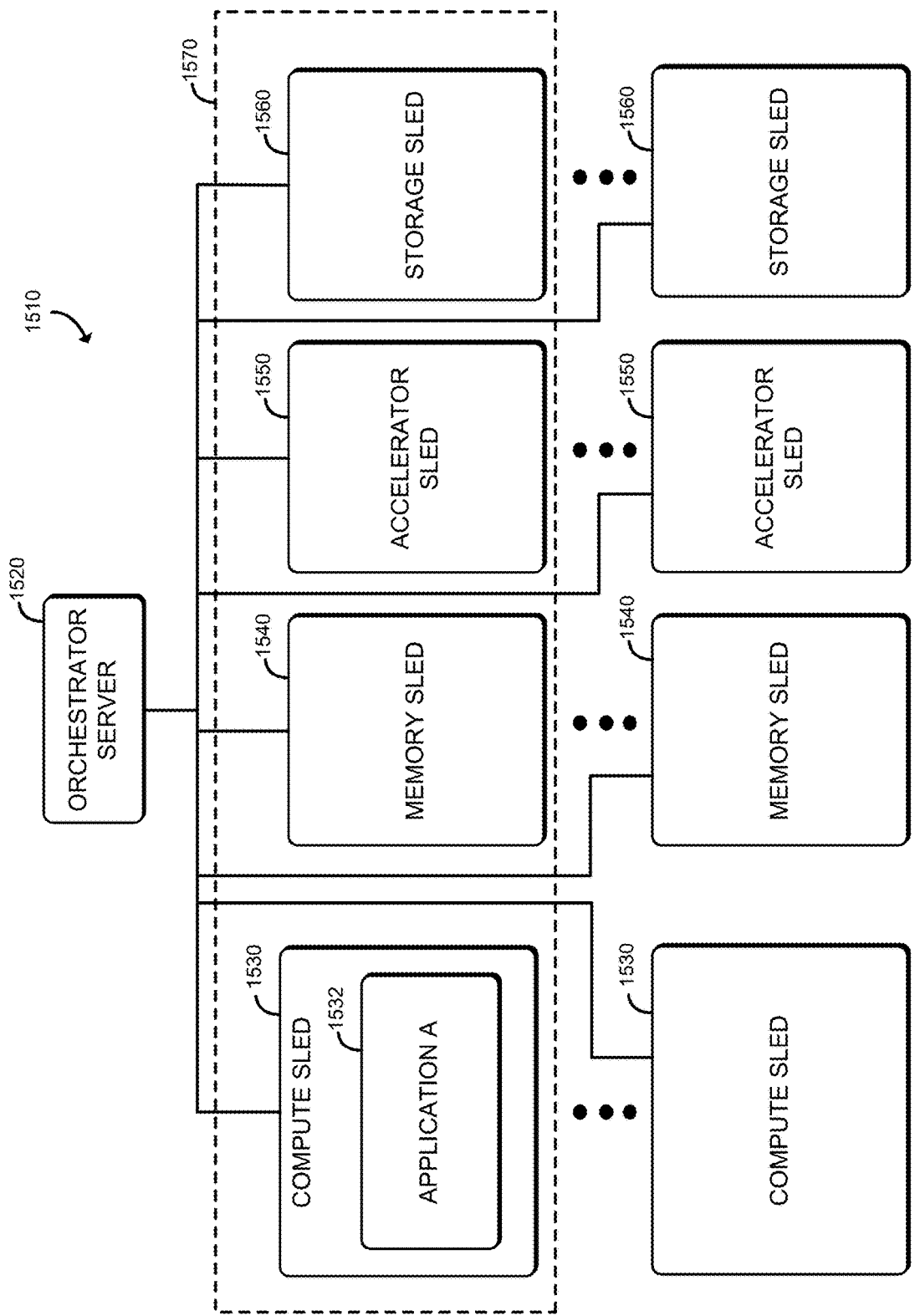
FIG. 15 is a simplified block diagram of a system that may be established within the data center of FIG. 1 to execute workloads with managed nodes composed of disaggregated resources.

Referring now to FIG. 15, a system for executing one or more workloads (e.g., applications) may be implemented in accordance with the data center 100. In the illustrative embodiment, the system 1510 includes an orchestrator server 1520, which may be embodied as a managed node comprising a compute device (e.g., a compute sled 800) executing management software (e.g., a cloud operating environment, such as OpenStack) that is communicatively coupled to multiple sleds 400 including a large number of compute sleds 1530 (e.g., each similar to the compute sled 800), memory sleds 1540 (e.g., each similar to the memory sled 1400), accelerator sleds 1550 (e.g., each similar to the memory sled 1000), and storage sleds 1560 (e.g., each similar to the storage sled 1200). One or more of the sleds 1530, 1540, 1550, 1560 may be grouped into a managed node 1570, such as by the orchestrator server 1520, to collectively perform a workload (e.g., an application 1532 executed in a virtual machine or in a container). The managed node 1570 may be embodied as an assembly of physical resources 620, such as processors 820, memory resources 720, accelerator circuits 1020, or data storage 1250, from the same or different sleds 400. Further, the managed node may be established, defined, or "spun up" by the orchestrator server 1520 at the time a workload is to be assigned to the managed node or at any other time, and may exist regardless of whether any workloads are presently assigned to the managed node. In the illustrative embodiment, the orchestrator server 1520 may selectively allocate and/or deallocate physical resources 620 from the sleds 400 and/or add or remove one or more sleds 400 from the managed node 1570 as a function of quality of service (QoS) targets (e.g., performance targets associated with a throughput, latency, instructions per second, etc.) associated with a service level agreement for the workload (e.g., the application 1532). In doing so, the orchestrator server 1520 may receive telemetry data indicative of performance conditions (e.g., throughput, latency, instructions per second, etc.) in each sled 400 of the managed node 1570 and compare the telemetry data to the quality of service targets to determine whether the quality of service targets are being satisfied. If the so, the orchestrator server 1520 may additionally determine whether one or more physical resources may be deallocated from the managed node 1570 while still satisfying the QoS targets, thereby freeing up those physical resources for use in another managed node (e.g., to execute a different workload). Alternatively, if the QoS targets are not presently satisfied, the orchestrator server 1520 may determine to dynamically allocate additional physical resources to assist in the execution of the workload (e.g., the application 1532) while the workload is executing Additionally, in some embodiments, the orchestrator server 1520 may identify trends in the resource utilization of the workload (e.g., the application 1532), such as by identifying phases of execution (e.g., time periods in which different operations, each having different resource utilizations characteristics, are performed) of the workload (e.g., the application 1532) and pre-emptively identifying available resources in the data center 100 and allocating them to the managed node 1570 (e.g., within a predefined time period of the associated phase beginning). In some embodiments, the orchestrator server 1520 may model performance based on various latencies and a distribution scheme to place workloads among compute sleds and other resources (e.g., accelerator sleds, memory sleds, storage sleds) in the data center 100. For example, the orchestrator server 1520 may utilize a model that accounts for the performance of resources on the sleds 400 (e.g., FPGA performance, memory access latency, etc.) and the performance (e.g., congestion, latency, bandwidth) of the path through the network to the resource (e.g., FPGA). As such, the orchestrator server 1520 may determine which resource(s) should be used with which workloads based on the total latency associated with each potential resource available in the data center 100 (e.g., the latency associated with the performance of the resource itself in addition to the latency associated with the path through the network between the compute sled executing the workload and the sled 400 on which the resource is located).

In some embodiments, the orchestrator server 1520 may generate a map of heat generation in the data center 100 using telemetry data (e.g., temperatures, fan speeds, etc.) reported from the sleds 400 and allocate resources to managed nodes as a function of the map of heat generation and predicted heat generation associated with different workloads, to maintain a target temperature and heat distribution in the data center 100. Additionally or alternatively, in some embodiments, the orchestrator server 1520 may organize received telemetry data into a hierarchical model that is indicative of a relationship between the managed nodes (e.g., a spatial relationship such as the physical locations of the resources of the managed nodes within the data center 100 and/or a functional relationship, such as groupings of the managed nodes by the customers the managed nodes provide services for, the types of functions typically performed by the managed nodes, managed nodes that typically share or exchange workloads among each other, etc.). Based on differences in the physical locations and resources in the managed nodes, a given workload may exhibit different resource utilizations (e.g., cause a different internal temperature, use a different percentage of processor or memory capacity) across the resources of different managed nodes. The orchestrator server 1520 may determine the differences based on the telemetry data stored in the hierarchical model and factor the differences into a prediction of future resource utilization of a workload if the workload is reassigned from one managed node to another managed node, to accurately balance resource utilization in the data center 100.

To reduce the computational load on the orchestrator server 1520 and the data transfer load on the network, in some embodiments, the orchestrator server 1520 may send self-test information to the sleds 400 to enable each sled 400 to locally (e.g., on the sled 400) determine whether telemetry data generated by the sled 400 satisfies one or more conditions (e.g., an available capacity that satisfies a predefined threshold, a temperature that satisfies a predefined threshold, etc.). Each sled 400 may then report back a simplified result (e.g., yes or no) to the orchestrator server 1520, which the orchestrator server 1520 may utilize in determining the allocation of resources to managed nodes.

Figure 16:
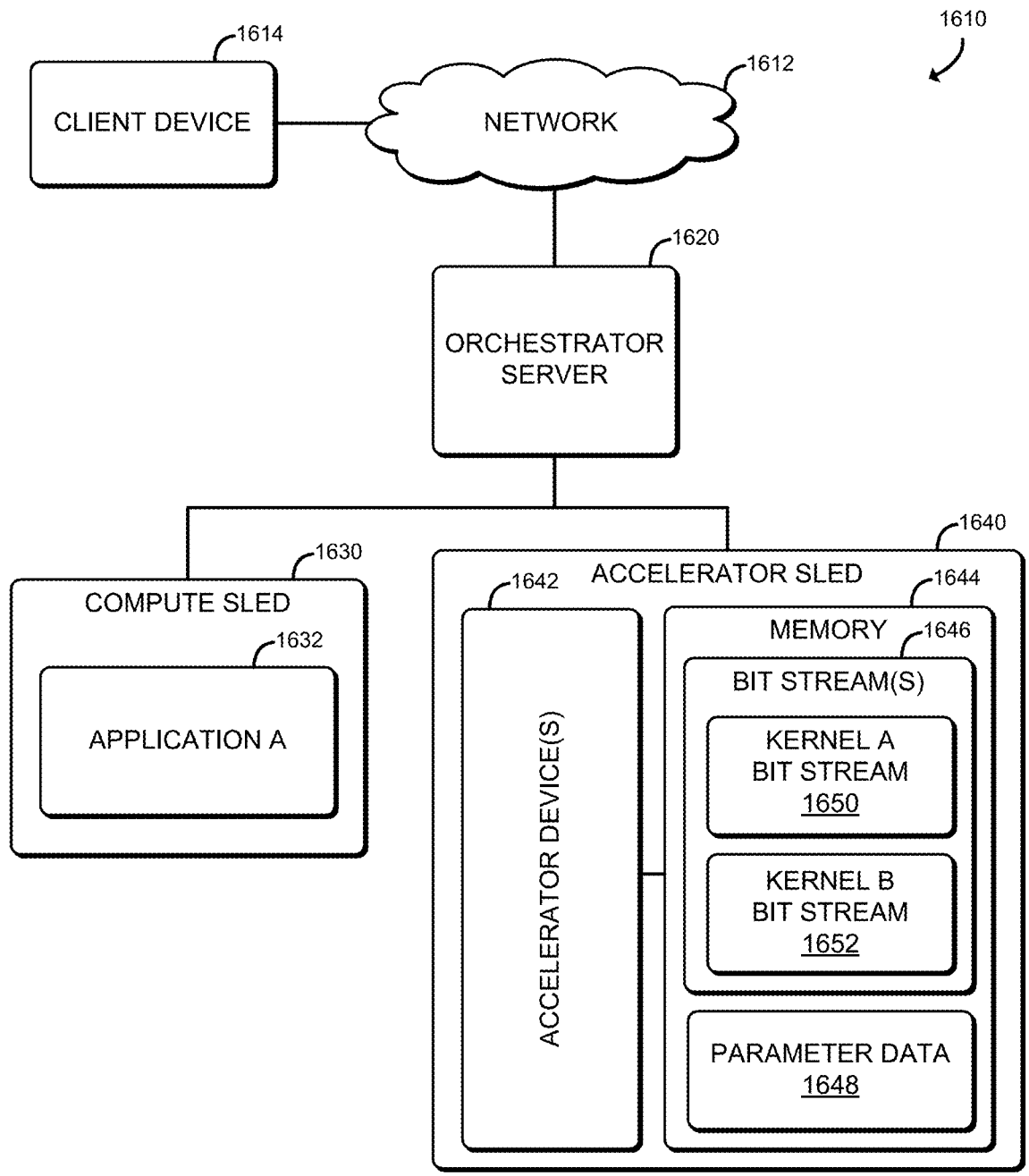
FIG. 16 is a simplified block diagram of at least one embodiment of a system for providing efficient reprovisioning in an accelerator device.

Referring now to FIG. 16, a system 1610 for providing efficient reprovisioning (e.g., of kernels) in an accelerator device may be implemented in accordance with the data center 100 described above with reference to FIG. 1. In the illustrative embodiment, the system 1610 includes an orchestrator server 1620 communicatively coupled to multiple sleds including a compute sled 1630 and an accelerator sled 1640. One or more of the sleds 1630, 1640 may be grouped into a managed node, such as by the orchestrator server 1620, to collectively perform a workload (e.g., an application 1632). A managed node may be embodied as an assembly of resources, such as compute resources, memory resources, storage resources, or other resources, from the same or different sleds or racks. Further, a managed node may be established, defined, or "spun up" by the orchestrator server 1620 at the time a workload is to be assigned to the managed node or at any other time, and may exist regardless of whether any workloads are presently assigned to the managed node. The system 1610 may be located in a data center and provide storage and compute services (e.g., cloud services) to a client device 1614 that is in communication with the system 1610 through a network 1612. The orchestrator server 1620 may support a cloud operating environment, such as OpenStack, and managed nodes established by the orchestrator server 1620 may execute one or more applications or processes (i.e., workloads), such as in virtual machines or containers, on behalf of a user of the client device 1614.

In the illustrative embodiment, the compute sled 1630 is similar to the sled 205-4 of FIG. 2, and, in operation, executes the application 1632 (e.g., a workload). The accelerator sled 1640 includes one or more accelerator devices 1642 coupled to a memory 1644 (e.g., random access memory (RAM)) which may temporarily store one or more bit streams 1646 and parameter data 1648. Each bit stream 1646 may be embodied as any data that defines a kernel that is executable by the accelerator device(s) 1642 to perform one or more functions (e.g., portions of a workload). For example, each bit stream 1646 may be embodied as a set of instructions for performing a cryptographic function, an arithmetic function, a hashing function, and/or other functions performable by an accelerator device 1642. The bit streams 1646, in the illustrative embodiment, include a bit stream 1650 that defines one kernel (e.g., kernel A) and another bit stream 1652 that defines a different kernel (e.g., kernel B). Further, in the illustrative embodiment, kernel A and kernel B are to be executed in sequence, as successive portions of the same workload (e.g., the application 1632). The parameter data 1648 may be embodied as any data (e.g., input data) usable by a kernel in the execution of an associated function. As described in more detail below, in operation, the accelerator sled 1640 may configure the accelerator device 1642 with one bit stream (e.g., the bit stream 1650) to establish kernel A on the accelerator device 1642, execute kernel A on input data in the parameter data 1648, write an output data set resulting from the execution of the kernel A to the parameter data 1648, reconfigure the accelerator device 1642 with the bit stream 1652 to establish kernel B, and use the output data previously written to the memory 1644 as input data to kernel B. By temporarily retaining the output of kernel A in memory and reusing it as input to kernel B, rather than sending, through the network 1612, the output data to the compute sled 1630, which then would send the output data back through the network to an accelerator device (e.g., the same accelerator device or a different accelerator device) to execute the subsequent kernel (e.g., kernel B), the accelerator sled 1640 may significantly reduce the overall latency incurred in accelerating a sequence of portions of a workload that have data dependence between them (e.g., using output data of one kernel as input data for the successive kernel).

Figure 17:
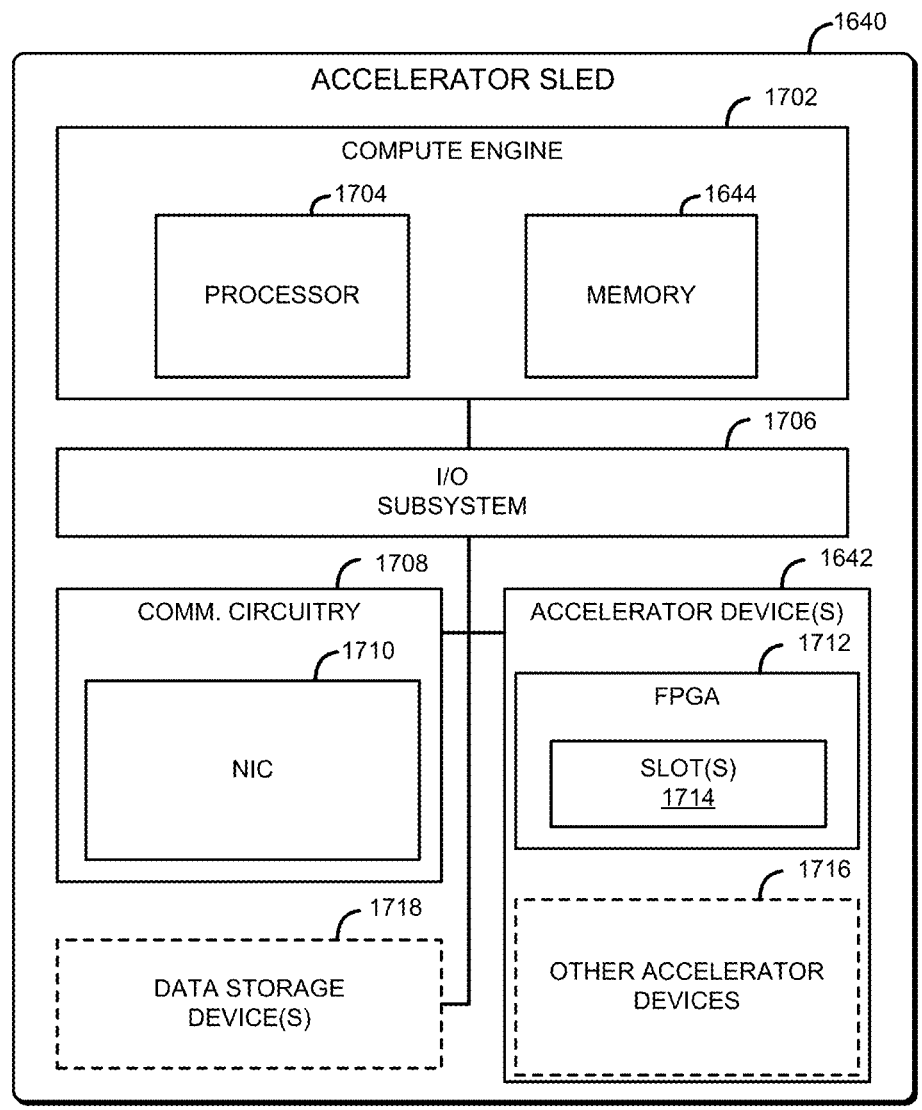
FIG. 17 is a simplified block diagram of at least one embodiment of an accelerator sled of the system of FIG. 16.

Referring now to FIG. 17, the accelerator sled 1640 may be embodied as any type of compute device capable of performing the functions described herein, including configuring an accelerator device with a bit stream to establish a kernel, executing the kernel to produce output data, writing the output data to onboard memory (e.g., memory located on the accelerator sled 1640), configuring the accelerator device with a second bit stream to establish a second kernel, and executing, with the output data in the memory as input data, the second kernel. As shown in FIG. 17, the illustrative accelerator sled 1640 includes a compute engine 1702, an input/output (I/O) subsystem 1706, communication circuitry 1708, and the one or more accelerator devices 1642. Of course, in other embodiments, the accelerator sled 1640 may include other or additional components, such as those commonly found in a computer (e.g., display, peripheral devices, etc.). Additionally, in some embodiments, one or more of the illustrative components may be incorporated in, or otherwise form a portion of, another component.

The compute engine 1702 may be embodied as any type of device or collection of devices capable of performing various compute functions described below. In some embodiments, the compute engine 1702 may be embodied as a single device such as an integrated circuit, an embedded system, a field-programmable gate array (FPGA), a system-on-a-chip (SOC), or other integrated system or device. In the illustrative embodiment, the compute engine 1702 includes or is embodied as a processor 1704 and the memory 1644. The processor 1704 may be embodied as any type of device or circuitry capable of performing the functions described herein. For example, the processor 1704 may be embodied as a microcontroller, a single or multi-core processor(s), or other processor or processing/controlling circuit. In some embodiments, the processor 1704 may be embodied as, include, or be coupled to an FPGA, an application specific integrated circuit (ASIC), reconfigurable hardware or hardware circuitry, or other specialized hardware to facilitate performance of the functions described herein.

The memory 1644 may be embodied as any type of volatile (e.g., dynamic random access memory (DRAM), etc.) or non-volatile memory or data storage capable of performing the functions described herein. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

In one embodiment, the memory device is a block addressable memory device, such as those based on NAND or NOR technologies. A memory device may also include future generation nonvolatile devices, such as a three dimensional crosspoint memory device (e.g., Intel 3D XPoint™ memory), or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product.

In some embodiments, 3D crosspoint memory (e.g., Intel 3D XPoint™ memory) may comprise a transistor-less stackable cross point architecture in which memory cells sit at the intersection of word lines and bit lines and are individually addressable and in which bit storage is based on a change in bulk resistance. In some embodiments, all or a portion of the memory 1644 may be integrated into the processor 1704. In operation, the memory 1644 may store various software and data used during operation such as sequence data, bit stream data, parameter data, applications, programs, and libraries.

The compute engine 1702 is communicatively coupled to other components of the accelerator sled 1640 via the I/O subsystem 1706, which may be embodied as circuitry and/or components to facilitate input/output operations with the compute engine 1702 (e.g., with the processor 1704 and/or the memory 1644) and other components of the accelerator sled 1640. For example, the I/O subsystem 1706 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 1706 may form a portion of a system-on-a-chip (SoC) and be incorporated, along with one or more of the processor 1704, the memory 1644, and other components of the accelerator sled 1640, into the compute engine 1702.

The communication circuitry 1708 may be embodied as any communication circuit, device, or collection thereof, capable of enabling communications over the network 1612 between the accelerator sled 1640 and another compute device (e.g., the compute sled 1630, the orchestrator server 1620). The communication circuitry 1708 may be configured to use any one or more communication technology (e.g., wired or wireless communications) and associated protocols (e.g., Ethernet, Bluetooth®, Wi-Fi®, WiMAX, etc.) to effect such communication.

The communication circuitry 1708 may include a network interface controller (NIC) 1710, which may also be referred to as a host fabric interface (HFI). The NIC 1710 may be embodied as one or more add-in-boards, daughter cards, network interface cards, controller chips, chipsets, or other devices that may be used by the accelerator sled 1640 to connect with another compute device (e.g., the compute sled 1630, the orchestrator server 1620, etc.). In some embodiments, the NIC 1710 may be embodied as part of a system-on-a-chip (SoC) that includes one or more processors, or included on a multichip package that also contains one or more processors. In some embodiments, the NIC 1710 may include a local processor (not shown) and/or a local memory (not shown) that are both local to the NIC 1710. In such embodiments, the local processor of the NIC 1710 may be capable of performing one or more of the functions of the compute engine 1702 described herein. Additionally or alternatively, in such embodiments, the local memory of the NIC 1710 may be integrated into one or more components of the accelerator sled 1640 at the board level, socket level, chip level, and/or other levels.

The accelerator devices 1642, may include an FPGA 1712. In the illustrative embodiment, the FPGA 1712 includes one or more slots 1714, each of which may be embodied as a portion of the logic or circuitry (e.g., logic gates) present on the FPGA 1712 and which may be programmed with a bit stream to provide a kernel capable of accelerating a particular function. While one FPGA 1712 is shown, it should be appreciated that in other embodiments, multiple FPGAs may be included in the accelerator sled 1640. Further, the accelerator sled 1640 may include one or more other accelerator devices 1716, which may be embodied as any circuitry or devices (e.g., co-processor(s), graphics processing units (GPUs), etc.) capable of executing one or more functions faster than a general purpose processor.

The accelerator sled 1640 may also include one or more data storage devices 1718, which may be embodied as any type of devices configured for short-term or long-term storage of data such as, for example, memory devices and circuits, memory cards, hard disk drives, solid-state drives, or other data storage devices. Each data storage device 1718 may include a system partition that stores data and firmware code for the data storage device 1718. Each data storage device 1718 may also include one or more operating system partitions that store data files and executables for operating systems.

The orchestrator server 1620, the compute sled 1630, and the client device 1614 may have components similar to those described in FIG. 17, with the exception that, in some embodiments, orchestrator server 1620, the compute sled 1630, and/or the client device 1614 may not include the accelerator devices 1642. The description of those components of the accelerator sled 1640 is equally applicable to the description of components of those devices and is not repeated herein for clarity of the description. Further, it should be appreciated that any of the accelerator sled 1640, the compute sled 1630, the orchestrator server 1620, or the client device 1614 may include other components, sub-components, and devices commonly found in a computing device, which are not discussed above in reference to the accelerator sled 1640 and not discussed herein for clarity of the description.

As described above, the orchestrator server 1620, the sleds 1630, 1640, and the client device 1614 are illustratively in communication via the network 1612, which may be embodied as any type of wired or wireless communication network, including global networks (e.g., the Internet), local area networks (LANs) or wide area networks (WANs), cellular networks (e.g., Global System for Mobile Communications (GSM), 3G, Long Term Evolution (LTE), Worldwide Interoperability for Microwave Access (WiMAX), etc.), digital subscriber line (DSL) networks, cable networks (e.g., coaxial networks, fiber networks, etc.), or any combination thereof.

Figure 18:
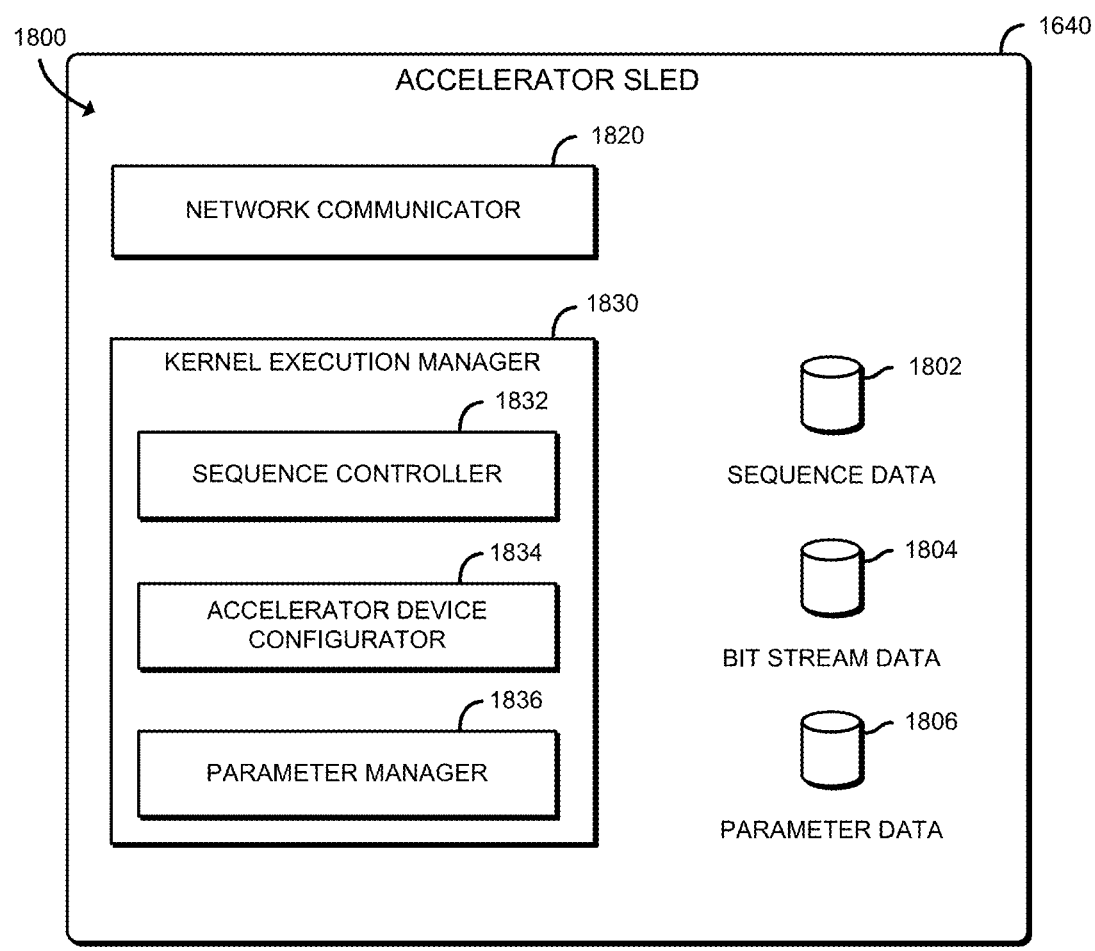
FIG. 18 is a simplified block diagram of at least one embodiment of an environment that may be established by the accelerator sled of FIGS. 16 and 17.

Referring now to FIG. 18, the accelerator sled 1640 may establish an environment 1800 during operation. The illustrative environment 1800 includes a network communicator 1820 and a kernel execution manager 1830. Each of the components of the environment 1800 may be embodied as hardware, firmware, software, or a combination thereof. As such, in some embodiments, one or more of the components of the environment 1800 may be embodied as circuitry or a collection of electrical devices (e.g., network communicator circuitry 1820, kernel execution manager circuitry 1830, etc.). It should be appreciated that, in such embodiments, one or more of the network communicator circuitry 1820 or kernel execution manager circuitry 1830 may form a portion of one or more of the compute engine 1702, accelerator devices 1642, the I/O subsystem 1706, the communication circuitry 1708, and/or other components of the accelerator sled 1640. In the illustrative embodiment, the environment 1800 includes sequence data 1802, which may be embodied as any data indicative of a sequence in which kernels are to be executed to accelerate the performance of a workload (e.g., the application 1632). The accelerator sled 1640 may receive the sequence data 1802 from a remote compute device (e.g., the compute sled 1630) through the network 1612 (e.g., as part of a request to execute the kernels). Further, the illustrative embodiment includes bit stream data 1804, which may be embodied as one or more bit streams (e.g., the bit streams 1646). In the illustrative embodiment, the accelerator sled 1640 may also receive the bit stream data from a remote compute device (e.g., the compute sled 1630) through the network 1612. Additionally, the illustrative environment 1800 includes parameter data 1806, which is similar to the parameter data 1648 described above with reference to FIG. 16.

In the illustrative environment 1800, the network communicator 1820, which may be embodied as hardware, firmware, software, virtualized hardware, emulated architecture, and/or a combination thereof as discussed above, is configured to facilitate inbound and outbound network communications (e.g., network traffic, network packets, network flows, etc.) to and from the accelerator sled 1640, respectively. To do so, the network communicator 1820 is configured to receive and process data packets from one system or computing device (e.g., the compute sled 1630, the orchestrator server 1620, etc.) and to prepare and send data packets to a computing device or system (e.g., the compute sled 1630, the orchestrator server 1620, etc.). Accordingly, in some embodiments, at least a portion of the functionality of the network communicator 1820 may be performed by the communication circuitry 1708, and, in the illustrative embodiment, by the NIC 1710.

The kernel execution manager 1830, which may be embodied as hardware, firmware, software, virtualized hardware, emulated architecture, and/or a combination thereof, is to configure an accelerator device of the accelerator sled 1640 with a bit stream associated with a kernel defined in a sequence of kernels (e.g., in the sequence data 1802), execute the kernel to produce output data, store the output data in the memory (e.g., as the parameter data 1806), configure the accelerator device with a second bit stream associated with a second kernel in the sequence, and execute the second kernel using the output data produced form the first kernel as input to the second kernel (e.g., by reading the parameter data 1806 from the memory). To do so, in the illustrative embodiment, the kernel execution manager 1830 includes a sequence controller 1832, an accelerator device configurator 1834, and a parameter manager 1836.

The sequence controller 1832, in the illustrative embodiment, is configured to obtain the sequence data 1802 (e.g., from a remote compute device such as the compute sled 1630) and determine, as function of the sequence data 1802 and the present position in the sequence data 1802 at any given time, which kernel should be executed by the accelerator device (e.g., the FPGA 1712). In the illustrative embodiment, the accelerator device configurator 1834 is configured to read a bit stream from the bit stream data 1804 and configure the accelerator device (e.g., the FPGA 1712) with the read bit stream, such as by programming logic gates in a slot (e.g., the slot 1714) of the accelerator device (e.g., the FPGA 1712), to establish the corresponding kernel. In the illustrative embodiment, the accelerator device configurator 1834 configures the accelerator device in response to a request to do so by the sequence controller 1832, such as when one kernel in the sequence data 1802 has completed and the next kernel indicated in the sequence data 1802 is to be executed. The parameter manager 1836, in the illustrative embodiment, is configured provide input parameters (e.g., an input data set) to a kernel for execution thereon (e.g., compressing an input data set, encrypting the input data set, etc.) and storing (e.g., in the parameter data 1806 in the memory 1644) output data produced by the kernel for use as input data to a subsequently executed kernel.

It should be appreciated that each of the sequence controller 1832, the accelerator device configurator 1834, and the parameter manager 1836 may be separately embodied as hardware, firmware, software, virtualized hardware, emulated architecture, and/or a combination thereof. For example, the sequence controller 1832 may be embodied as a hardware component, while the accelerator device configurator 1834 and the parameter manager 1836 are embodied as virtualized hardware components or as some other combination of hardware, firmware, software, virtualized hardware, emulated architecture, and/or a combination thereof.

Figure 19:
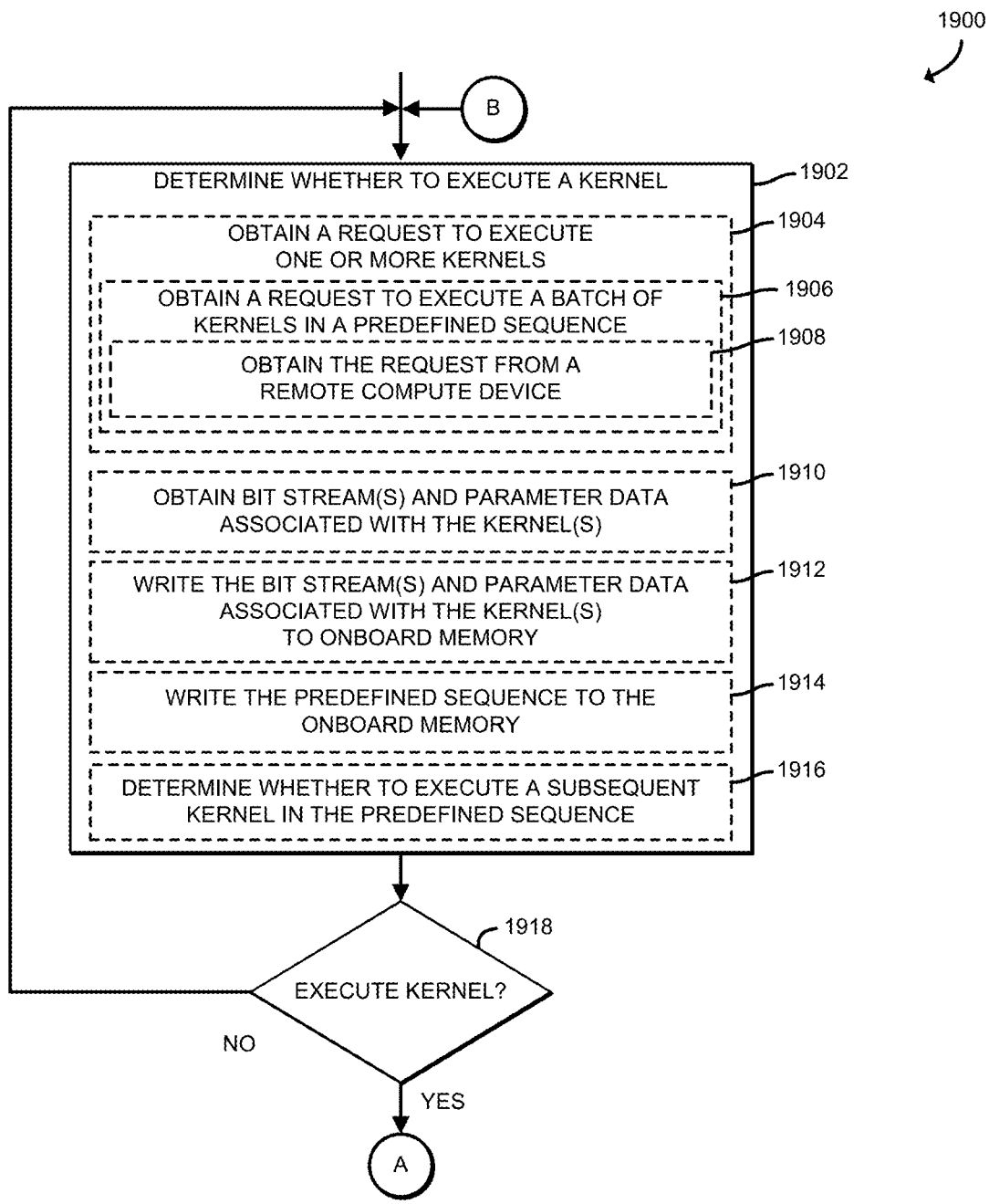
FIGS. 19-20 are a simplified flow diagram of at least one embodiment of a method for providing efficient reprovisioning in an accelerator device that may be performed by the accelerator sled of FIGS. 16 and 17.

Referring now to FIG. 19, the accelerator sled 1640, in operation, may execute a method 1900 for providing efficient reprovisioning of kernels. The method 1900 begins with block 1902, in which the accelerator sled 1640 determines whether to execute a kernel. In doing so, the accelerator sled 1640 may obtain a request to execute one or more kernels, as indicated in block 1904. The accelerator sled 1640 may obtain a request to execute a batch of kernels in a predefined sequence (e.g., the sequence data 1802), as indicated in block 1906. For example, the predefined sequence may be to execute kernel A, followed by kernel B. In some embodiments, the predefined sequence may include one or more conditions under which one kernel (e.g., kernel B) is to be executed after a previous kernel (e.g., kernel A), and other conditions in which an alternative kernel (e.g., a kernel C) is to be executed after the previous kernel (e.g., kernel A), such as when a value in the output data satisfies a predefined threshold value. Regardless, as indicated in block 1908, the accelerator sled may obtain the request from a remote compute device, such as the compute sled 1630 or the orchestrator server 1620. As indicated in block 1910, the accelerator sled 1640 may obtain one or more bit streams (e.g., the bit stream data 1804) and parameter data (e.g., the parameter data 1806) associated with the kernel(s) to be executed. For example, the request from the remote compute device (e.g., the compute sled 1630 or the orchestrator server 1620) may include the bit streams and parameter data (e.g., input data). As indicated in block 1912, in the illustrative embodiment, the accelerator sled 1640 writes the bit stream (s) and parameter data associated with the kernel(s) to the memory 1644. Additionally, the accelerator sled 1640 may write the predefined sequence (e.g., from block 1906) to the memory 1644, as indicated in block 1914. In later iterations of block 1902, the accelerator sled 1640 may determine whether to execute a subsequent kernel in the predefined sequence (e.g., after kernel A has finished executing), as indicated in block 1916. In block 1918, the accelerator sled 1640 determines the subsequent course of action based on whether the accelerator sled 1640 has determined whether to execute a kernel (e.g., a kernel identified in the request from block 1904 or a subsequent kernel identified in the predefined sequence from block 1906). In response to a determination to execute a kernel, the method 1900 advances to block 1920 of FIG. 20, in which the accelerator sled 1640 executes the kernel with an accelerator device 1642 (e.g., the FPGA 1712) of the accelerator sled 1640. Otherwise, the method 1900 loops back to block 1902 in which the accelerator sled 1640 again determines whether to execute a kernel.

Figure 20:
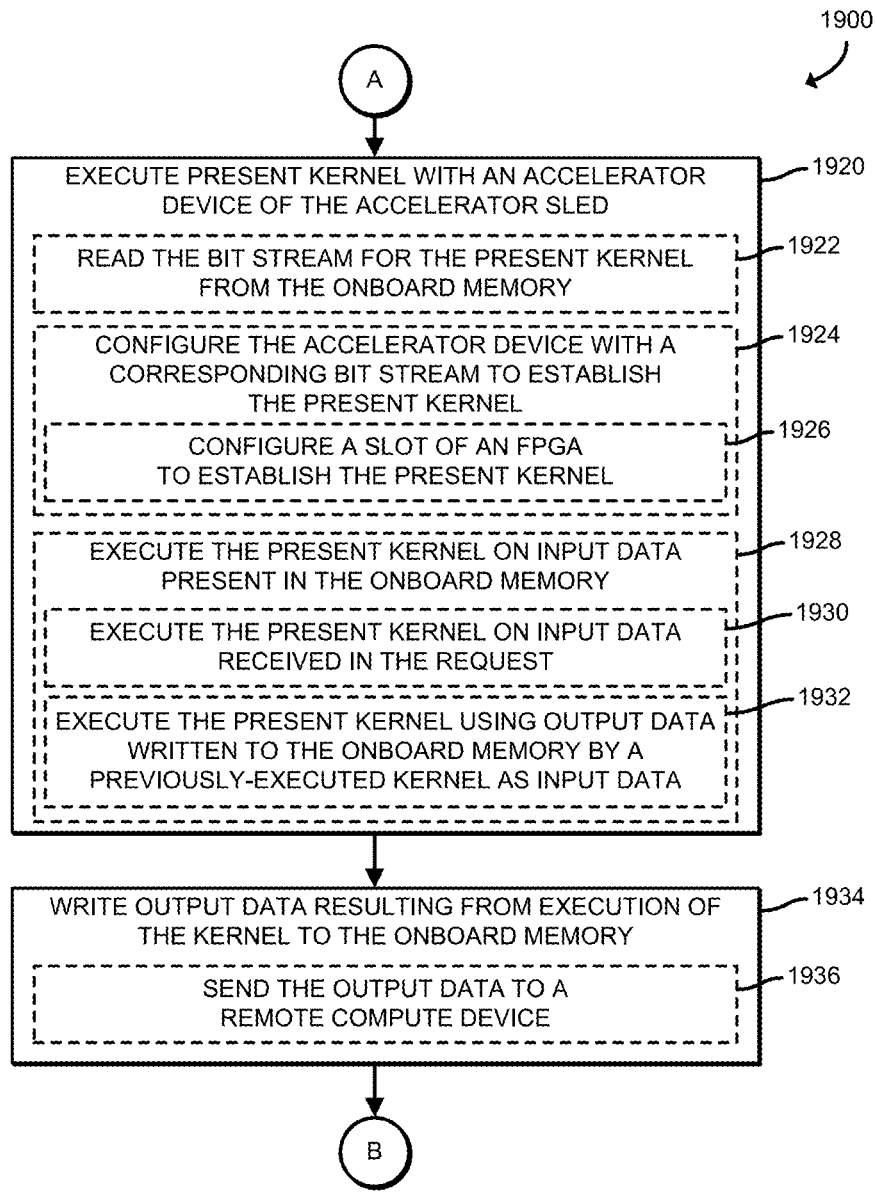

Referring now to FIG. 20, in executing the kernel with the accelerator device 1642, the accelerator sled 1640, in the illustrative embodiment, reads the bit stream associated with the present kernel from the memory 1644, as indicated in block 1922. Additionally, in the illustrative embodiment, the accelerator sled 1640 configures the accelerator device 1642 with the bit stream (e.g., programs the logic gates) corresponding to the kernel to establish the kernel (e.g., enable the accelerator device 1642 to execute the function associated with the kernel), as indicated in block 1924. In configuring the accelerator device 1642, the accelerator sled 1640 may configure a slot of an FPGA (e.g., the slot 1714 of the FPGA 1712) to establish the kernel, as indicated in block 1926. In the illustrative embodiment, the accelerator sled 1640 executes, with the accelerator device 1642, the kernel on input data (e.g., an input data set in the parameter data 1806) present in the memory 1644, as indicated in block 1928. In doing so, in the illustrative embodiment, the accelerator sled 1640 executes the kernel on input data received in the request (e.g., the request from block 1904), as indicated in block 1930. In later iterations of the method 1900, the accelerator device 1642 may execute the kernel using output data written to the memory 1644 by a previously-executed kernel, as input data (e.g., decrypting data that was decompressed by the previous kernel), as indicated in block 1932. Afterwards, in block 1934, the accelerator sled 1640 writes output data resulting from the execution of the kernel to the memory 1644 (e.g., writing a decompressed version of a data set that was decompressed by the present kernel). Further, and as indicated in block 1936, the accelerator sled 1640 may send the output data to a remote compute device (e.g., the compute sled 1630), as indicated in block 1936. Afterwards, the method 1900 loops back to block 1902 of FIG. 19 to again determine whether to execute a kernel.

EXAMPLES

Illustrative examples of the technologies disclosed herein are provided below. An embodiment of the technologies may include any one or more, and any combination of, the examples described below.

Example 1 includes an accelerator sled comprising a memory; an accelerator device coupled to the memory, wherein the accelerator device is to (i) configure the accelerator device with a first bit stream to establish a first kernel; (ii) execute the first kernel to produce output data; (iii) write the output data to the memory; (iv) configure the accelerator device with a second bit stream to establish a second kernel; and (v) execute the second kernel with the output data in the memory used as input data to the second kernel.

Example 2 includes the subject matter of Example 1, and wherein the accelerator device is further to obtain a request to execute a batch of kernels in a predefined sequence and wherein to configure the accelerator device with a first bit stream comprises to configure, in response to the request to execute a batch of kernels in a predefined sequence, the accelerator device with the first bit stream.

Example 3 includes the subject matter of any of Examples 1 and 2, and wherein to configure the accelerator device with the second bit stream comprises to determine whether to execute a subsequent kernel in the predefined sequence; and configure, in response to a determination to execute a subsequent kernel in the predefined sequence, the accelerator device with the second bit stream.

Example 4 includes the subject matter of any of Examples 1-3, and wherein the accelerator device is to write the predefined sequence to the memory.

Example 5 includes the subject matter of any of Examples 1-4, and wherein the accelerator device is a field programmable gate array with a slot and wherein to configure the accelerator device with the first bit stream comprises to configure the slot with the first bit stream.

Example 6 includes the subject matter of any of Examples 1-5, and wherein the accelerator device is further to receive a request to execute the first kernel, wherein the request includes input data, and wherein to execute the first kernel comprises to execute the first kernel on the input data included in the request.

Example 7 includes the subject matter of any of Examples 1-6, and wherein the accelerator device is to write, to the memory, the input data received from the request.

Example 8 includes the subject matter of any of Examples 1-7, and wherein the accelerator device is further to receive a request that includes the first bit stream and the second bit stream; and write the first bit stream and second bit stream to the memory.

Example 9 includes the subject matter of any of Examples 1-8, and wherein to configure the accelerator device with the first bit stream comprises to read the first bit stream from the memory.

Example 10 includes the subject matter of any of Examples 1-9, and wherein the output data is first output data, wherein to execute the second kernel comprises to produce second output data, and the accelerator device is further to send the second output data to a remote compute device.

Example 11 includes the subject matter of any of Examples 1-10, and wherein the accelerator device is further to send the first output data to the remote compute device.

Example 12 includes the subject matter of any of Examples 1-11, and wherein to send second output data to a remote compute device comprises to send the second output data to a compute sled.

Example 13 includes a method comprising configuring, by an accelerator sled, an accelerator device of the accelerator sled with a first bit stream to establish a first kernel; executing, by the accelerator sled, the first kernel to produce output data; writing, by the accelerator sled, the output data to a memory of the accelerator sled; configuring, by the accelerator sled, the accelerator device with a second bit stream to establish a second kernel; and executing, by the accelerator sled, the second kernel with the output data in the memory used as input data to the second kernel.

Example 14 includes the subject matter of Example 13, and further including obtaining, by the accelerator sled, a request to execute a batch of kernels in a predefined sequence and wherein configuring the accelerator device with a first bit stream comprises configuring, in response to the request to execute a batch of kernels in a predefined sequence, the accelerator device with the first bit stream.

Example 15 includes the subject matter of any of Examples 13 and 14, and wherein configuring the accelerator device with the second bit stream comprises determining whether to execute a subsequent kernel in the predefined sequence; and configuring, in response to a determination to execute a subsequent kernel in the predefined sequence, the accelerator device with the second bit stream.

Example 16 includes the subject matter of any of Examples 13-15, and further including writing, by the accelerator sled, the predefined sequence to the memory.

Example 17 includes the subject matter of any of Examples 13-16, and wherein the accelerator device is a field programmable gate array with a slot and wherein configuring the accelerator device with the first bit stream comprises configuring the slot with the first bit stream.

Example 18 includes the subject matter of any of Examples 13-17, and further including receiving, by the accelerator sled, a request to execute the first kernel, wherein the request includes input data, and wherein executing the first kernel comprises executing the first kernel on the input data included in the request.

Example 19 includes the subject matter of any of Examples 13-18, and further including writing, by the accelerator sled and to the memory, the input data received from the request.

Example 20 includes the subject matter of any of Examples 13-19, and further including receiving, by the accelerator sled, a request that includes the first bit stream and the second bit stream; and writing, by the accelerator sled, the first bit stream and second bit stream to the memory.

Example 21 includes the subject matter of any of Examples 13-20, and wherein configuring the accelerator device with the first bit stream comprises reading the first bit stream from the memory.

Example 22 includes the subject matter of any of Examples 13-21, and wherein the output data is first output data and executing the second kernel comprises producing second output data, the method further comprising sending, by the accelerator sled, the second output data to a remote compute device.

Example 23 includes the subject matter of any of Examples 13-22, and further including sending, by the accelerator sled, the first output data to the remote compute device.

Example 24 includes the subject matter of any of Examples 13-23, and wherein sending the second output data to a remote compute device comprises sending the second output data to a compute sled.

Example 25 includes an accelerator sled comprising means for performing the method of any of Examples 13-24.

Example 26 includes one or more machine-readable storage media comprising a plurality of instructions stored thereon that, in response to being executed, cause an accelerator sled to perform the method of any of Examples 13-24.

Example 27 includes an accelerator sled comprising a compute engine to perform the method of any of Examples 13-24.

Example 28 includes an accelerator sled comprising a memory; an accelerator device coupled to the memory; and kernel execution manager circuitry to (i) configure the accelerator device with a first bit stream to establish a first kernel; (ii) execute, with the accelerator device, the first kernel to produce output data; (iii) write the output data to the memory; (iv) configure the accelerator device with a second bit stream to establish a second kernel; and (v) execute, with the accelerator device, the second kernel with the output data in the memory used as input data to the second kernel.

Example 29 includes the subject matter of Example 28, and further including network communicator circuitry to obtain a request to execute a batch of kernels in a predefined sequence; and wherein to configure the accelerator device with a first bit stream comprises to configure, in response to the request to execute a batch of kernels in a predefined sequence, the accelerator device with the first bit stream.

Example 30 includes the subject matter of any of Examples 28 and 29, and wherein to configure the accelerator device with the second bit stream comprises to determine whether to execute a subsequent kernel in the predefined sequence; and configure, in response to a determination to execute a subsequent kernel in the predefined sequence, the accelerator device with the second bit stream.

Example 31 includes the subject matter of any of Examples 28-30, and wherein the kernel execution manager circuitry is further to write the predefined sequence to the memory.

Example 32 includes the subject matter of any of Examples 28-31, and wherein the accelerator device is a field programmable gate array with a slot and wherein to configure the accelerator device with the first bit stream comprises to configure the slot with the first bit stream.

Example 33 includes the subject matter of any of Examples 28-32, and further including network communicator circuitry to receive a request to execute the first kernel, wherein the request includes input data, and wherein to execute the first kernel comprises to execute the first kernel on the input data included in the request.

Example 34 includes the subject matter of any of Examples 28-33, and wherein the kernel execution manager circuitry is to write, to the memory, the input data received from the request.

Example 35 includes the subject matter of any of Examples 28-34, and further including network communicator circuitry to receive a request that includes the first bit stream and the second bit stream; wherein the kernel execution manager circuitry is further to write the first bit stream and second bit stream to the memory.

Example 36 includes the subject matter of any of Examples 28-35, and wherein to configure the accelerator device with the first bit stream comprises to read the first bit stream from the memory.

Example 37 includes the subject matter of any of Examples 28-36, and wherein the output data is first output data, wherein to execute the second kernel comprises to produce second output data, and the kernel execution manager circuitry is further to send the second output data to a remote compute device.

Example 38 includes the subject matter of any of Examples 28-37, and wherein the kernel execution manager circuitry is further to send the first output data to the remote compute device.

Example 39 includes the subject matter of any of Examples 28-38, and wherein to send second output data to a remote compute device comprises to send the second output data to a compute sled.

Example 40 includes an accelerator sled comprising circuitry for configuring, by an accelerator sled, an accelerator device of the accelerator sled with a first bit stream to establish a first kernel; circuitry for executing, by the accelerator sled, the first kernel to produce output data; circuitry for writing, by the accelerator sled, the output data to a memory of the accelerator sled; circuitry for configuring, by the accelerator sled, the accelerator device with a second bit stream to establish a second kernel; and means for executing, by the accelerator sled, the second kernel with the output data in the memory used as input data to the second kernel.

Example 41 includes the subject matter of Example 40, and further including circuitry for obtaining a request to execute a batch of kernels in a predefined sequence and wherein the circuitry for configuring the accelerator device with a first bit stream comprises circuitry for configuring, in response to the request to execute a batch of kernels in a predefined sequence, the accelerator device with the first bit stream.

Example 42 includes the subject matter of any of Examples 40 and 41, and wherein the circuitry for configuring the accelerator device with the second bit stream comprises circuitry for determining whether to execute a subsequent kernel in the predefined sequence; and circuitry for configuring, in response to a determination to execute a subsequent kernel in the predefined sequence, the accelerator device with the second bit stream.

Example 43 includes the subject matter of any of Examples 40-42, and further including circuitry for writing the predefined sequence to the memory.

Example 44 includes the subject matter of any of Examples 40-43, and wherein the accelerator device is a field programmable gate array with a slot and wherein the circuitry for configuring the accelerator device with the first bit stream comprises circuitry for configuring the slot with the first bit stream.

Example 45 includes the subject matter of any of Examples 40-44, and further including circuitry for receiving a request to execute the first kernel, wherein the request includes input data, and wherein the circuitry for executing the first kernel comprises circuitry for executing the first kernel on the input data included in the request.

Example 46 includes the subject matter of any of Examples 40-45, and further including circuitry for writing, to the memory, the input data received from the request.

Example 47 includes the subject matter of any of Examples 40-46, and further including circuitry for receiving a request that includes the first bit stream and the second bit stream; and circuitry for writing the first bit stream and second bit stream to the memory.

Example 48 includes the subject matter of any of Examples 40-47, and wherein the circuitry for configuring the accelerator device with the first bit stream comprises circuitry for reading the first bit stream from the memory.

Example 49 includes the subject matter of any of Examples 40-48, and wherein the output data is first output data and the means for executing the second kernel comprises circuitry for producing second output data, the accelerator sled further comprising circuitry for sending the second output data to a remote compute device.

Example 50 includes the subject matter of any of Examples 40-49, and further including circuitry for sending the first output data to the remote compute device.

Example 51 includes the subject matter of any of Examples 40-50, and wherein the circuitry for sending the second output data to a remote compute device comprises circuitry for sending the second output data to a compute sled.

The invention claimed is:

1. One or more non-transitory machine-readable storage media comprising a plurality of instructions stored thereon that, in response to being executed, cause one or more processors to:
provide a request to cause execution of a workload using one or more accelerator devices, wherein
the request is associated with input data for processing by a first kernel;
at least one of the one or more accelerator devices comprises a field programmable gate array (FPGA); and
execution of a workload using one or more accelerator devices comprises configuration of at least one of the one or more accelerator devices with a first bit stream to execute the first kernel to generate first output data and configuration of the at least one of the one or more accelerator devices with a second bit stream to execute a second kernel to generate second output data based on the first output data.

2. The non-transitory machine-readable storage media of claim 1, comprising a plurality of instructions stored thereon that, in response to being executed, cause the one or more processors to:
receive the second output data in one or more packets transmitted by a network interface from a platform that comprises memory that stores the second output data.

3. The non-transitory machine-readable storage media of claim 1, wherein the request is to specify a sequence of execution of the first kernel and the second kernel.

4. The non-transitory machine-readable storage media of claim 1, wherein:

the first kernel is to perform one or more of a cryptographic function, an arithmetic function, or a hashing function and
the second kernel is to perform one or more of a cryptographic function, an arithmetic function, or a hashing function.

5. The non-transitory machine-readable storage media of claim 1, wherein an orchestrator or an application is to provide the request to cause execution of a workload using one or more accelerator devices.

6. A system comprising:
one or more processors and
a machine-readable storage storing instructions, the instructions executable by the one or more processors, that cause the one or more processors to:
provide a request to cause execution of a workload using one or more accelerator devices, wherein
the request is associated with input data for processing by a first kernel;
at least one of the one or more accelerator devices comprises a field programmable gate array (FPGA); and
execution of a workload using one or more accelerator devices comprises configuration of at least one of the one or more accelerator devices with a first bit stream to execute the first kernel to generate first output data and configuration of the at least one of the one or more accelerator devices with a second bit stream to execute a second kernel to generate second output data based on the first output data.

7. The system of claim 6, comprising instructions stored by the machine-readable storage, the instructions executable by the one or more processors, that cause the one or more processors to:
receive the second output data in one or more packets transmitted by a network interface from a platform that comprises memory that stores the second output data.

8. The system of claim 6, wherein the request is to specify a sequence of execution of the first kernel and the second kernel.

9. The system of claim 6, wherein
the first kernel is to perform one or more of a cryptographic function, an arithmetic function, or a hashing function and
the second kernel is to perform one or more of a cryptographic function, an arithmetic function, or a hashing function.

10. The system of claim 6, wherein the instructions implement an orchestrator or an application.

11. The system of claim 6, comprising a network interface to transmit the request to a platform comprising the one or more accelerator devices and a memory, wherein the memory is to store the first output data for processing by the second kernel.

12. The system of claim 6, comprising a network interface to receive the request in one or more packets.

13. A method comprising:
providing a request to cause execution of a workload using one or more accelerator devices, wherein
the request is associated with input data for processing by a first kernel;
at least one of the one or more accelerator devices comprises a field programmable gate array (FPGA); and
execution of a workload using one or more accelerator devices comprises configuration of at least one of the one or more accelerator devices with a first bit stream to execute the first kernel to generate first output data and configuration of the at least one of the one or more accelerator devices with a second bit stream to execute a second kernel to generate second output data based on the first output data.

14. The method of claim 13, comprising:
receiving the second output data in one or more packets transmitted by a network interface from a platform that comprises memory that stores the second output data.

15. The method of claim 13, wherein the request specifies a sequence of execution of the first kernel and the second kernel.

16. The method of claim 13, wherein
the first kernel performs one or more of a cryptographic function, an arithmetic function, or a hashing function and
the second kernel performs one or more of a cryptographic function, an arithmetic function, or a hashing function.

17. The method of claim 13, comprising executing an orchestrator and wherein the orchestrator provides the request.

18. The method of claim 13, comprising executing an application and wherein the application provides the request.

19. The method of claim 13, comprising receiving the request in one or more packets at a network interface.

* * * * *